US012380960B2

(12) United States Patent
Thoppa et al.

(10) Patent No.: US 12,380,960 B2
(45) Date of Patent: Aug. 5, 2025

(54) NON-VOLATILE MEMORY WITH FASTER POST-ERASE DEFECT TESTING

(71) Applicant: SanDisk Technologies LLC, Addison, TX (US)

(72) Inventors: Sai Gautham Thoppa, San Jose, CA (US); Parth Amin, Livermore, CA (US); Anubhav Khandelwal, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 212 days.

(21) Appl. No.: 18/346,339

(22) Filed: Jul. 3, 2023

(65) Prior Publication Data

US 2024/0290412 A1 Aug. 29, 2024

Related U.S. Application Data

(60) Provisional application No. 63/486,527, filed on Feb. 23, 2023.

(51) Int. Cl.
| | |
|---|---|
| *G11C 29/44* | (2006.01) |
| *G06F 12/1009* | (2016.01) |
| *G11C 16/16* | (2006.01) |
| *G11C 16/34* | (2006.01) |
| *G11C 29/12* | (2006.01) |

(52) U.S. Cl.
CPC .......... *G11C 29/44* (2013.01); *G06F 12/1009* (2013.01); *G11C 16/16* (2013.01); *G11C 16/3445* (2013.01); *G11C 29/12005* (2013.01); *G11C 2029/1202* (2013.01)

(58) Field of Classification Search
CPC ..... G11C 29/44; G11C 16/16; G11C 16/3445; G11C 29/12005; G11C 2029/1202; G06F 12/1009
USPC ........................................................ 365/218
See application file for complete search history.

(56) References Cited

U.S. PATENT DOCUMENTS

| | | |
|---|---|---|
| 9,293,205 B2 | 3/2016 | Lee |
| 9,449,694 B2 | 9/2016 | Paudel et al. |
| 9,484,104 B2 | 11/2016 | Lee et al. |
| 9,529,663 B1 | 12/2016 | Srinivasan et al. |

(Continued)

OTHER PUBLICATIONS

U.S. Appl. No. 17/939,795, filed Sep. 7, 2022.

*Primary Examiner* — Alexander Sofocleous
*Assistant Examiner* — Duy H Luong
(74) *Attorney, Agent, or Firm* — Pearl Cohen Zedek Latzer Baratz LLP

(57) ABSTRACT

As part of the erase operation for a memory block, one or more post-erase tests can be incorporated into the erase operation to see whether the block has grown any defects. After erasing a block and verifying the erase, the post-erase tests can be performed on the block. As these test involve biasing the block and performing a sensing operation, these post erase tests come with a time penalty. To reduce the associated time penalty and improve memory performance while incorporating the defect tests into the erase process, when biasing the memory array for the post-erase defect tests different ramp rates can be used. In particular, faster ramp rates for bias levels, such those applied to the word lines of the block, are used for the post-erase tests than are used for the same bias level when performing the standard read, program verify, or read verify operations.

20 Claims, 19 Drawing Sheets

(56) References Cited

U.S. PATENT DOCUMENTS

| | | | |
|---|---|---|---|
| 9,704,596 B1* | 7/2017 | Shim | G11C 16/0483 |
| 9,934,872 B2 | 4/2018 | Magia et al. | |
| 10,008,276 B2 | 6/2018 | Huynh et al. | |
| 10,037,812 B2* | 7/2018 | Shibata | G11C 16/3445 |
| 10,186,326 B2 | 1/2019 | Takizawa | |
| 10,861,537 B1* | 12/2020 | Lien | G11C 16/32 |
| 11,011,237 B2 | 5/2021 | Tsuda | |
| 11,309,041 B2 | 4/2022 | Li et al. | |
| 11,657,884 B2 | 5/2023 | Pachamuthu et al. | |
| 2002/0154545 A1* | 10/2002 | Tanaka | G11C 16/344 |
| | | | 365/185.22 |
| 2008/0198662 A1 | 8/2008 | Mokhlesi | |
| 2010/0199150 A1 | 8/2010 | Shalvi et al. | |
| 2014/0075252 A1 | 3/2014 | Luo et al. | |
| 2014/0104950 A1* | 4/2014 | Yano | G11C 16/10 |
| | | | 365/185.12 |
| 2016/0099064 A1* | 4/2016 | Shirota | G11C 16/16 |
| | | | 365/185.17 |
| 2016/0232985 A1 | 8/2016 | Sabde et al. | |
| 2017/0140833 A1* | 5/2017 | Caillat | G11C 16/08 |
| 2018/0196622 A1 | 7/2018 | Oshimi et al. | |
| 2019/0371395 A1* | 12/2019 | Lin | G11C 16/08 |
| 2020/0005873 A1 | 1/2020 | Yazovitsky et al. | |
| 2020/0091169 A1 | 3/2020 | Tokutomi | |
| 2021/0280260 A1 | 9/2021 | Shino | |
| 2021/0383886 A1* | 12/2021 | Alrod | G11C 29/42 |
| 2021/0398604 A1 | 12/2021 | Li et al. | |
| 2022/0334902 A1* | 10/2022 | Li | G11C 11/5671 |
| 2023/0058836 A1 | 2/2023 | Pachamuthu et al. | |
| 2023/0368850 A1* | 11/2023 | Xu | G11C 16/08 |
| 2024/0257881 A1* | 8/2024 | Xu | G11C 16/3445 |

* cited by examiner

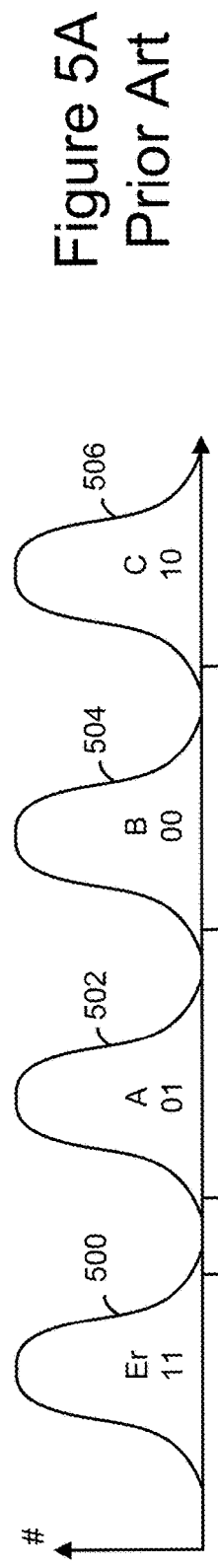
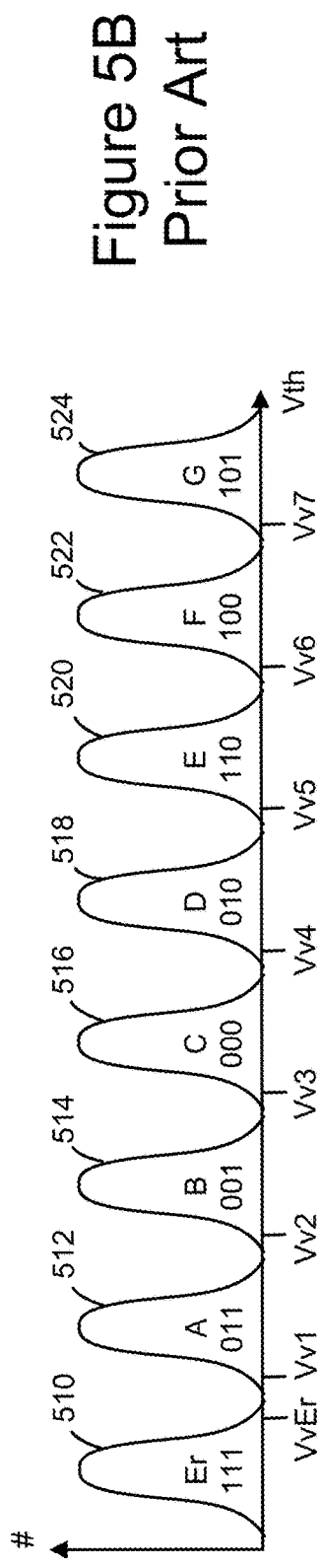
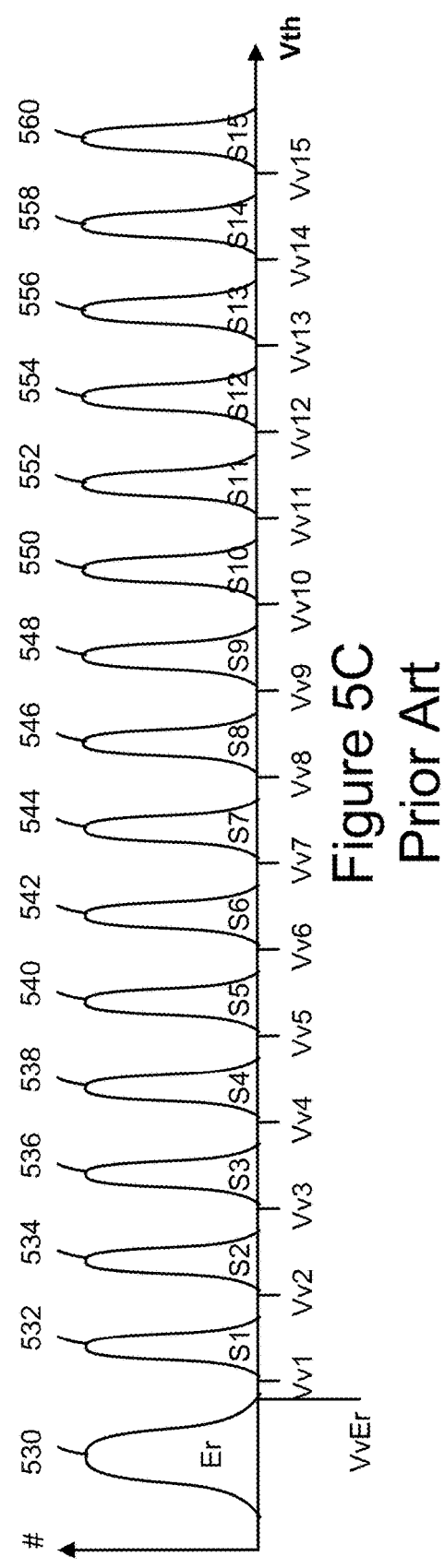
Figure 5A Prior Art
Figure 5B Prior Art
Figure 5C Prior Art

NON-VOLATILE MEMORY WITH FASTER POST-ERASE DEFECT TESTING

CLAIM OF PRIORITY

The present application claims priority from U.S. Provisional Patent Application No. 63/486,527, entitled "NON-VOLATILE MEMORY WITH FASTER POST-ERASE DEFECT TESTING," by Thoppa et al., filed Feb. 23, 2023, incorporated by reference herein in its entirety.

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has word lines that provide voltages to the control gates of the memory cell transistors. In some architectures, each word line connects to the control gate of one memory cell on each respective NAND string in the block. A portion of the word line that is adjacent to the memory cell may be considered to be the control gate of that cell.

The non-volatile memory cells may be programmed to store data. Typically, the memory cells are programmed to data states. Using two data states to store a single bit per cell is referred to herein as SLC programming. Using a greater number of data states allows for more bits to be stored per memory cell. Using additional data states to store two or more bits per cell is referred to herein as MLC programming. For example, four data states may be used to store two bits per memory cell, eight data states may be used in order to store three bits per memory cell, 16 data states may be used to store four bits per memory cell, etc. Some types of memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

Prior to programming NAND memory cells the memory cells are erased. Erasing the memory cells will typically lower the Vt of each memory cell that is not already below an erase verify reference voltage. Typically, many memory cells are erased at the same time. The term "erase block" or "erase group" may be used herein to refer to a group of NAND memory cells that share word lines and are erased together. It is also possible to erase multiple erase blocks together, such as one erase block on each plane on a memory die. However, such erase procedures may place a considerable strain on the voltage generator that provides the erase voltage.

Defects may exist in the memory structure following manufacturing. For example, there could be a short circuit between a word line and a channel of a NAND string. There could be a short circuit between two word lines. There could be a short circuit between a word line and conductive line that provides a voltage to a source line. Such defects may develop in the memory structure over time. Such defects can result in dysfunction of memory operations such as erase. To prevent failures of the non-volatile memory when in use due to defects that first present during operation by a user, manufacturers of non-volatile memory include various processes for testing the memory in an effort to detect defects before the non-volatile memory is used to store data. However, users of non-volatile memory want high performance, including fast operational speeds. Therefore, it is desirable for the testing of the memory for defects to use as little time as possible in order to not degrade memory performance.

BRIEF DESCRIPTION OF THE DRAWINGS

Like-numbered elements refer to common components in the different figures.

FIGS. 5A, 5B and 5C depict threshold voltage distributions.

DETAILED DESCRIPTION

Technology is disclosed herein for determining whether an erase block is defective. As part of the erase operation for a memory block, one or more post-erase tests can be incorporated into the erase operation to see whether the block has grown any defects. After erasing a block and verifying the erase, the post-erase tests can be performed on the block. As these test involve biasing the block and performing a sensing operation, these post erase tests come with a time penalty. To reduce the associated time penalty and improve memory performance while incorporating the defect tests into the erase process, when biasing the memory array for the post-erase defect tests different ramp rates can be used. In particular, faster ramp rates for bias levels, such those applied to the word lines of the block, are used for the post-erase test than are used for the same bias level when performing the standard read, program verify, or read verify operations.

Figure 1:
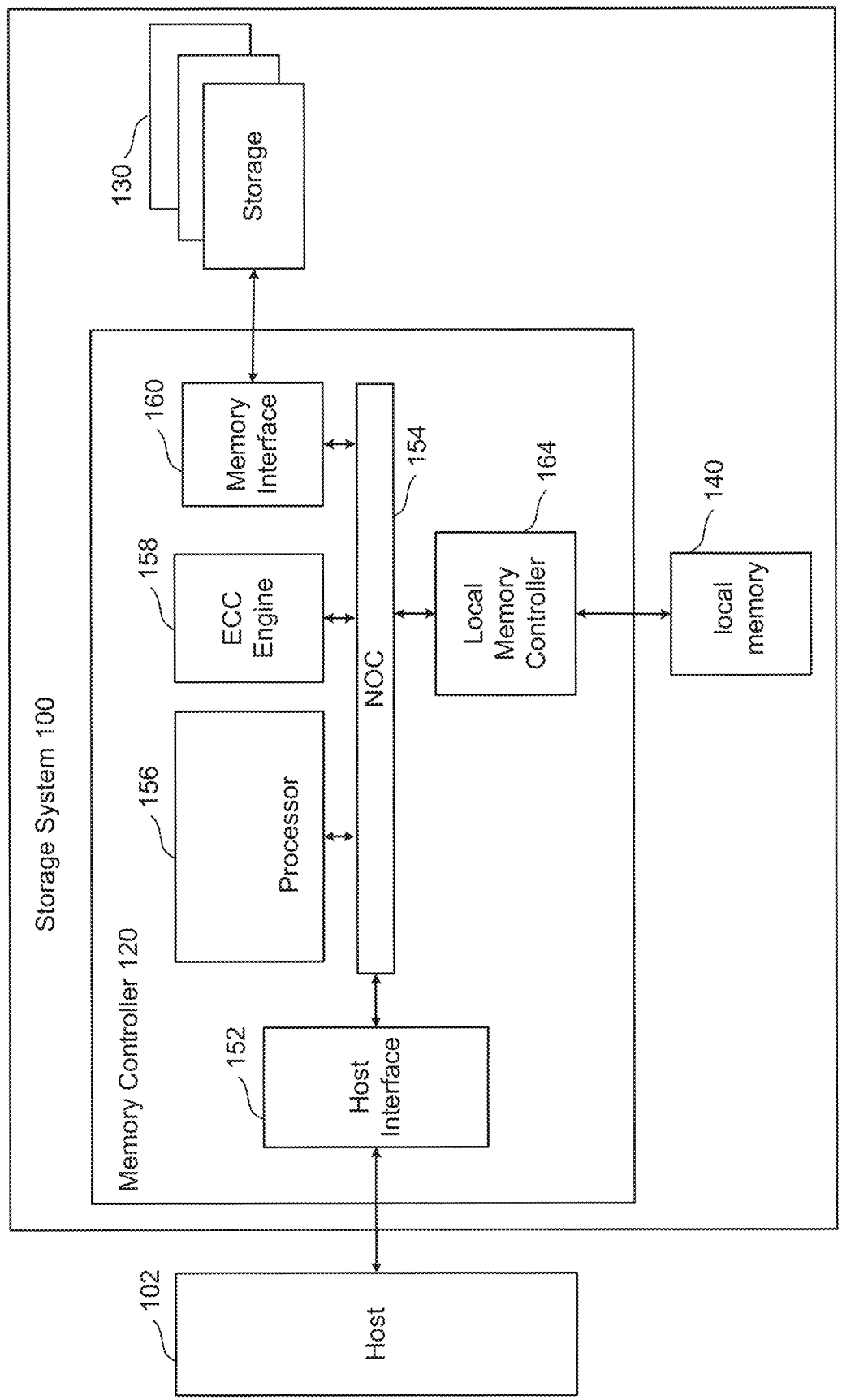
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
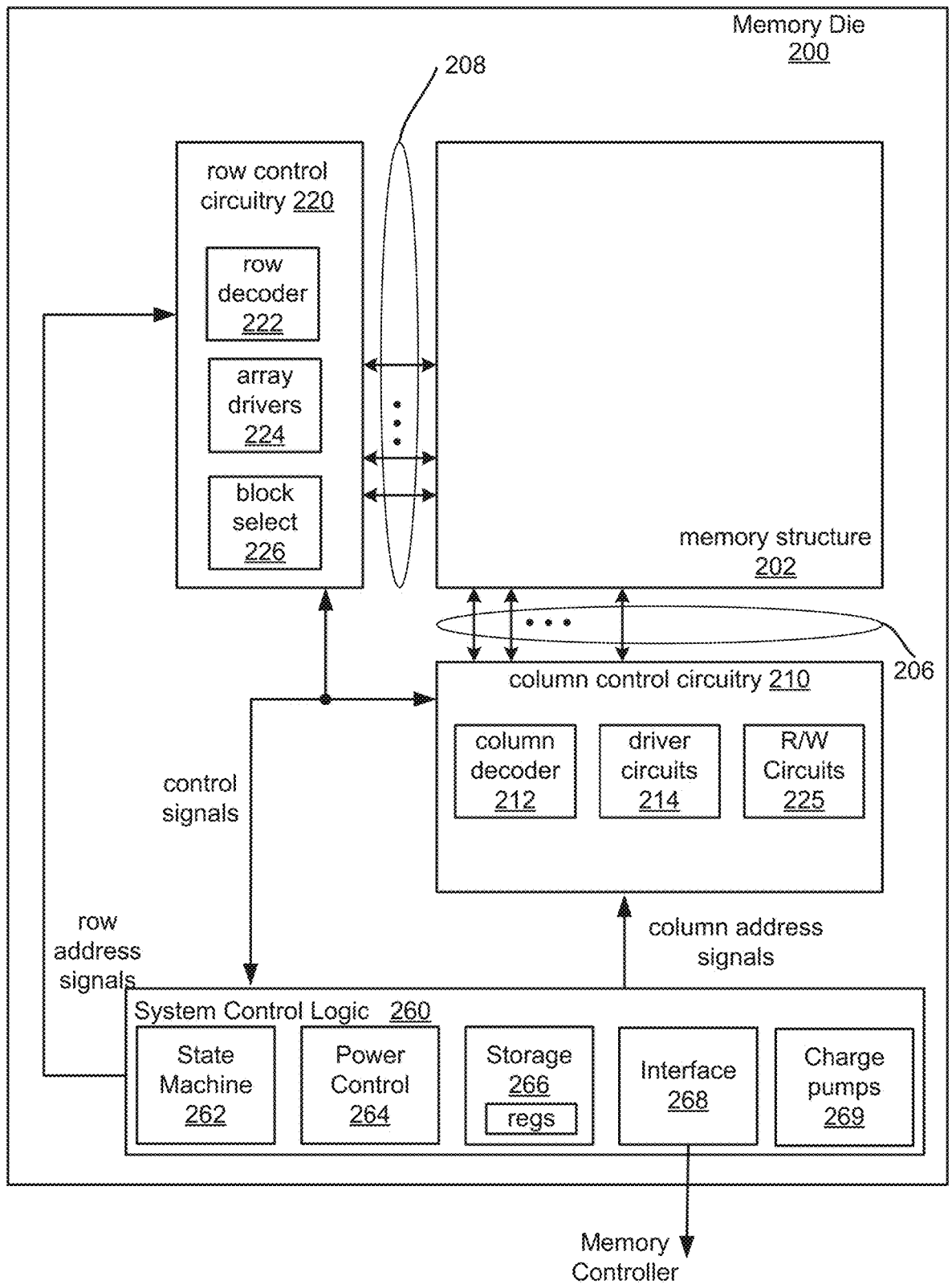
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202. The system control logic 260 is also shown to include charge pumps 269, which are voltage generators that can be used to generate operating voltages (e.g., read, program, and erase voltage levels) that are higher than the supply level. The charge pumps can be consider part of, and controlled, by power control module 264, but are explicitly included here as they enter into the discussion below.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of current, voltage, light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
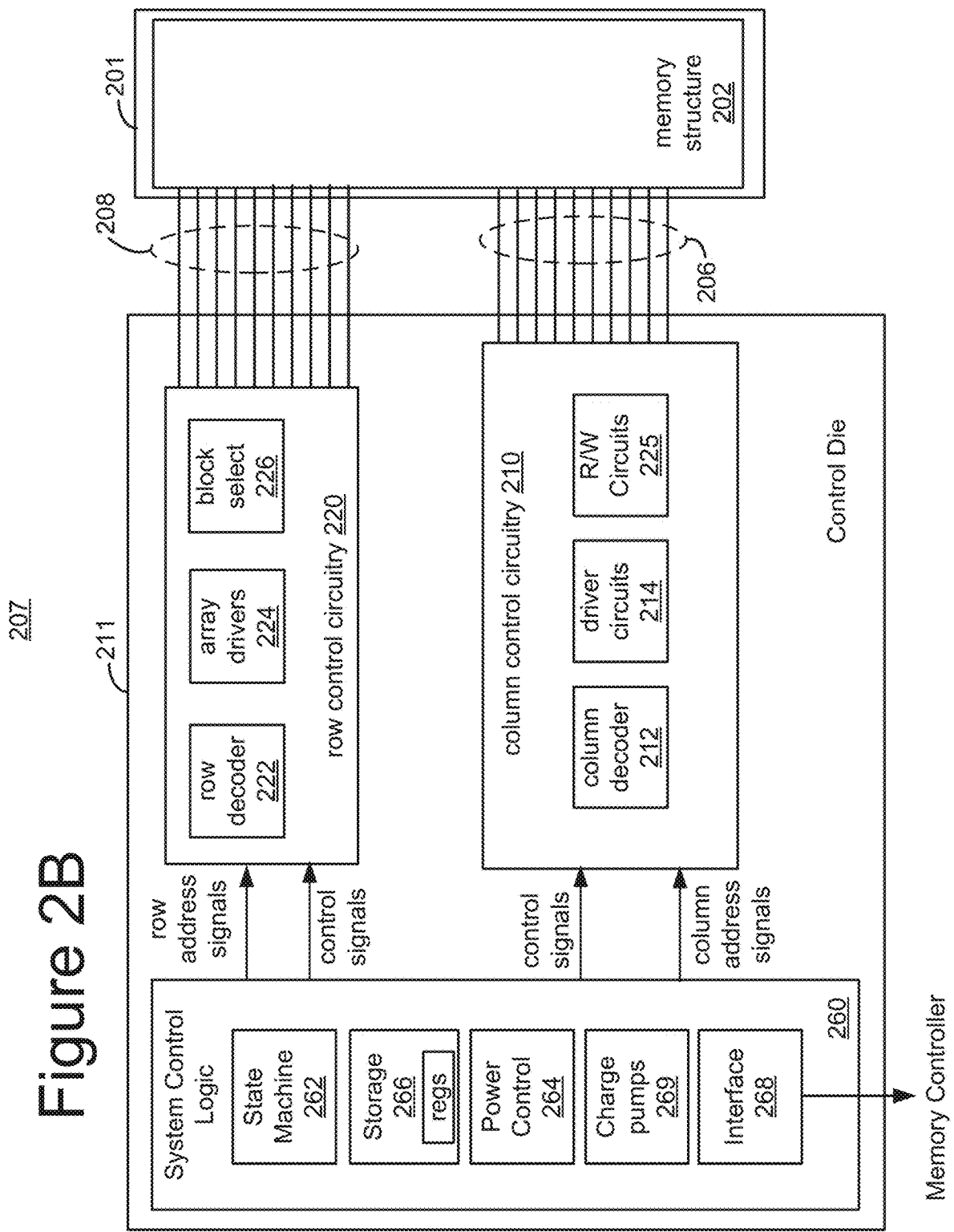
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 2C:
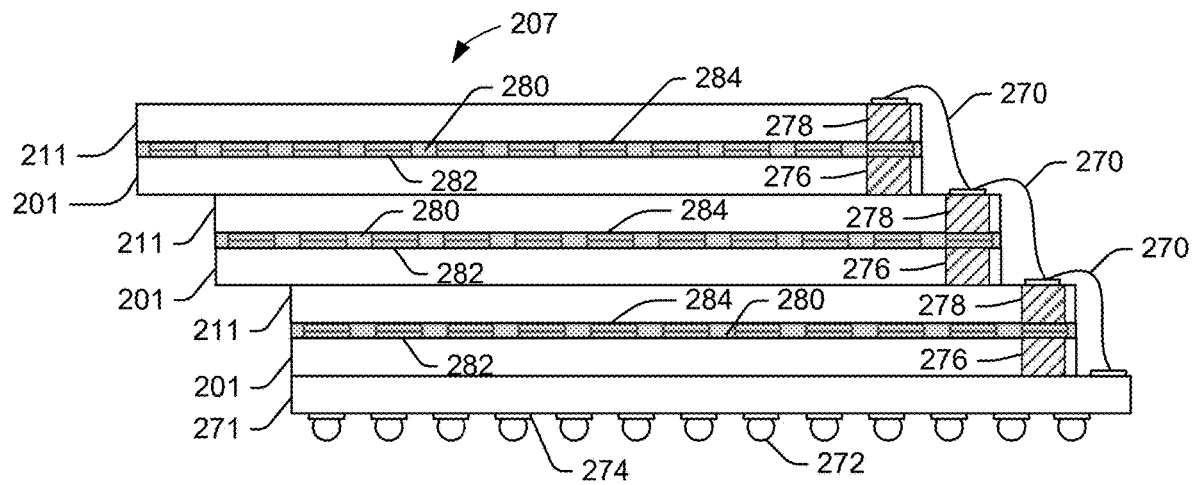
FIGS. 2C and 2D depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 2C depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 2C there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
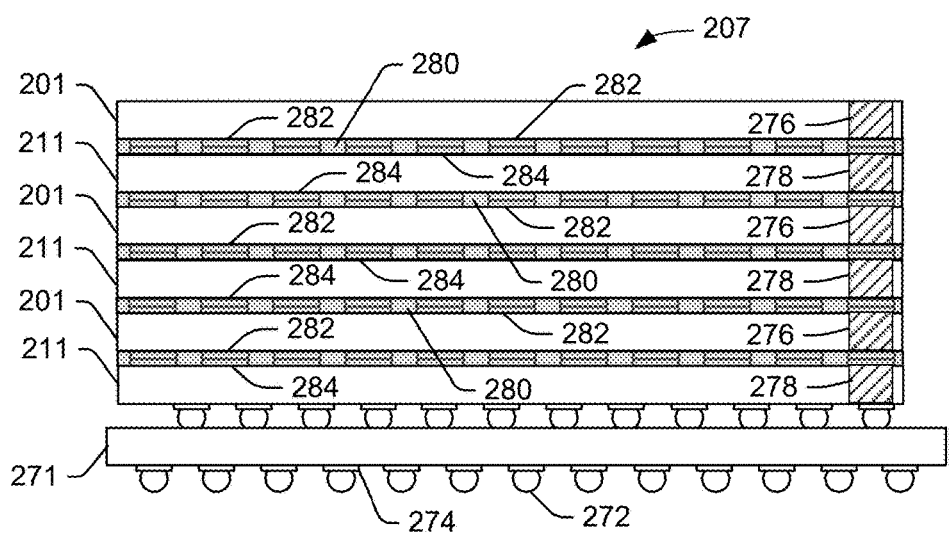

FIG. 2D depicts a side view of another embodiment of an integrated memory assembly 207 stacked on a substrate 271. The integrated memory assembly 207 of FIG. 2D has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 2CA, the integrated memory assembly 207 in FIG. 2D does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3:
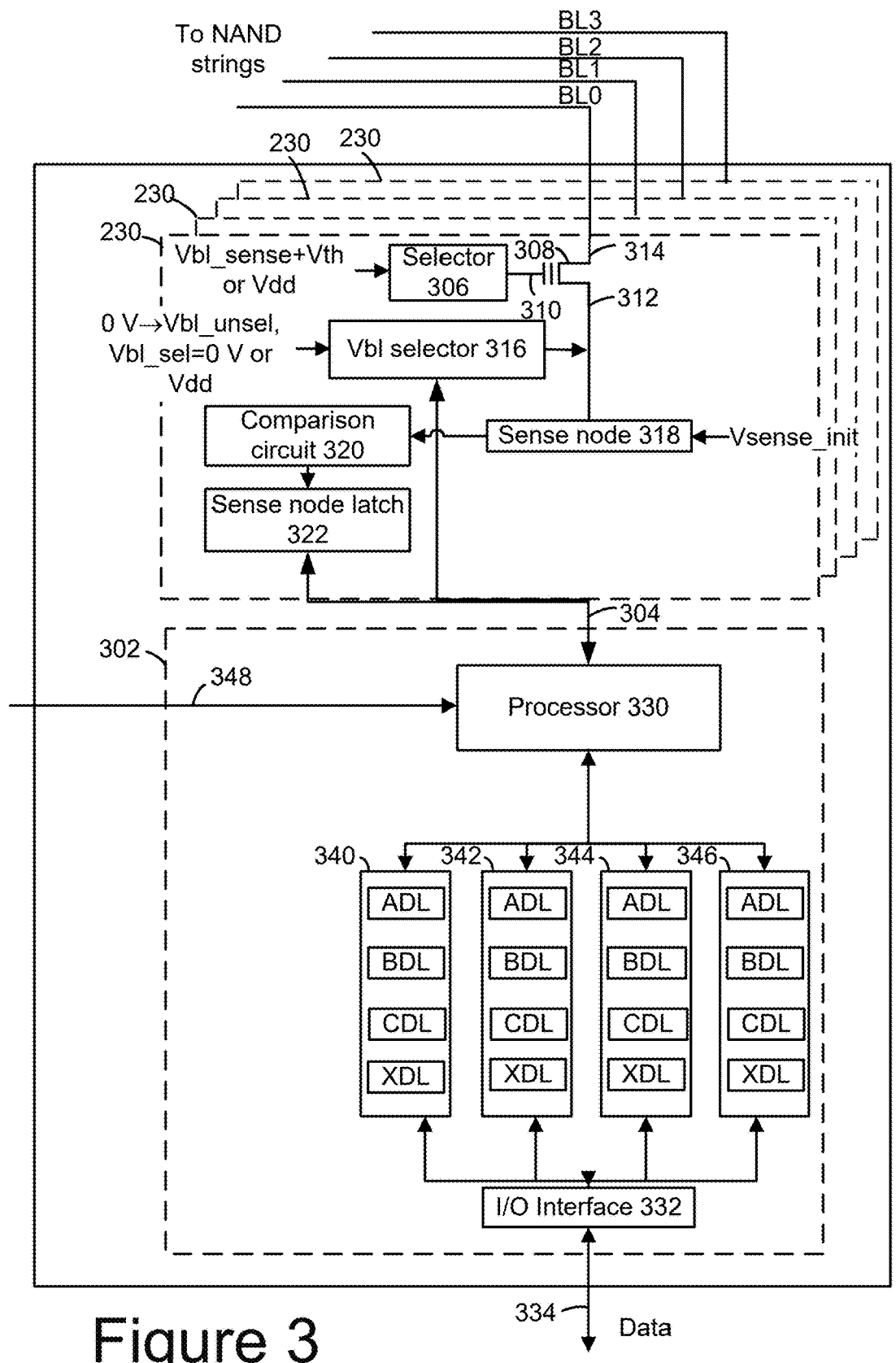
FIG. 3 depicts circuitry used to sense data from non-volatile memory.

FIG. 3 is a block diagram depicting one embodiment of a portion of column control circuitry 210 that is partitioned into a plurality of sense amplifiers 230, and a common portion, referred to as a managing circuit 302. In one embodiment, each sense amplifier 230 is connected to a respective bit line which in turn is connected to one or more NAND strings. In one example implementation, each bit line is connected to six NAND strings, with one NAND string per sub-block. Managing circuit 302 is connected to a set of multiple (e.g., four, eight, etc.) sense amplifiers 230. Each of the sense amplifiers 230 in a group communicates with the associated managing circuit via data bus 304.

Each sense amplifier 230 operates to provide voltages to bit lines (see BL0, BL1. BL2. BL3) during program, verify, erase and read operations. Sense amplifiers are also used to sense the condition (e.g., data state) to a memory cells in a NAND string connected to the bit line that connects to the respective sense amplifier.

Each sense amplifier 230 includes a selector 306 or switch connected to a transistor 308 (e.g., an nMOS). Based on voltages at the control gate 310 and drain 312 of the transistor 308, the transistor can operate as a pass gate or as a bit line clamp. When the voltage at the control gate is sufficiently higher than the voltage on the drain, the transistor operates as a pass gate to pass the voltage at the drain to the bit line (BL) at the source 314 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 306 may pass a power supply voltage Vdd, (e.g., 3-4 V) to the control gate of the transistor 308 to cause it to operate as a pass gate.

When the voltage at the control gate is lower than the voltage on the drain, the transistor 308 operates as a source-follower to set or clamp the bit line voltage at Vcg−Vth, where Vcg is the voltage on the control gate 310 and Vth, e.g., 0.7 V, is the threshold voltage of the transistor 308. This assumes the source line is at 0 V. If Vcelsrc is non-zero, the bit line voltage is clamped at Vcg−Vcelsrc−Vth. The transistor is therefore sometimes referred to as a bit line clamp (BLC) transistor, and the voltage Vcg on the control gate 310 is referred to as a bit line clamp voltage, Vblc. This mode can be used during sensing operations such as read and verify operations. The bit line voltage is thus set by the transistor 308 based on the voltage output by the selector 306. For example, the selector 306 may pass Vsense+Vth, e.g., 1.5 V, to the control gate of the transistor 308 to provide Vsense, e.g., 0.8 V, on the bit line. A Vbl selector 316 may pass a relatively high voltage such as Vdd to the drain 312, which is higher than the control gate voltage on the transistor 308, to provide the source-follower mode during sensing operations. Vbl refers to the bit line voltage.

The Vbl selector 316 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 316 can pass a program-enable voltage signal such as 0 V for respective bit lines of selected NAND strings during a program loop.

In one approach, the selector 306 of each sense circuit can be controlled separately from the selectors of other sense circuits. The Vbl selector 316 of each sense circuit can also be controlled separately from the Vbl selectors of other sense circuits.

During sensing, a sense node 318 is charged up to an initial voltage, Vsense_init, such as 3 V. The sense node is then passed to the bit line via the transistor 308, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 320 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation. The bit in the sense node latch 322 can also be used in a lockout scan to decide whether to set a bit line voltage to an inhibit or program level in a next program loop. L Managing circuit 302 comprises a processor 330, four example sets of data latches 340, 342, 344 and 346, and an I/O interface 332 coupled between the sets of data latches and the data bus 334. FIG. 3 shows four example sets of data latches 340, 342, 344 and 346; however, in other embodiments more or less than four can be implemented. In one embodiment, there is one set of latches for each sense amplifier 230. One set of three data latches, e.g., comprising individual latches ADL, BDL, CDL and XDL, can be provided for each sense circuit. In some cases, a different number of data latches may be used. In a three bit per memory cell embodiment, ADL stores a bit for a lower page of data, BDL stores a bit for a middle page of data, CDL stores a bit for an upper page of data and XDL serves as an interface latch for storing/latching data from the memory controller.

Processor 330 performs computations, such as to determine the data stored in the sensed memory cell and store the determined data in the set of data latches. Each set of data latches 340-346 is used to store data bits determined by processor 330 during a read operation, and to store data bits imported from the data bus 334 during a program operation which represent write data meant to be programmed into the memory. I/O interface 332 provides an interface between data latches 340-346 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to processor 330 via the data bus 304. At that point, processor 330 determines the resultant memory state by consideration of the tripping event(s) of the sense circuit and the information about the applied control gate voltage from the state machine via input lines 348. It then computes a binary encoding for the memory state and stores the resultant data bits into data latches 340-346.

Some implementations can include multiple processors 330. In one embodiment, each processor 330 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 330 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 340-346 from the data bus 334. During reprogramming, a respective set of data latches of a memory cell can store data indicating when to enable the memory cell for reprogramming based on the program pulse magnitude.

The program operation, under the control of the state machine 262, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 330 monitors the read back memory state relative to the desired memory state. When the two are in agreement, processor 330 sets the bit line in a program inhibit mode such as by updating its latches. This inhibits the memory cell coupled to the bit line from further programming even if additional program pulses are applied to its control gate.

Figure 4:
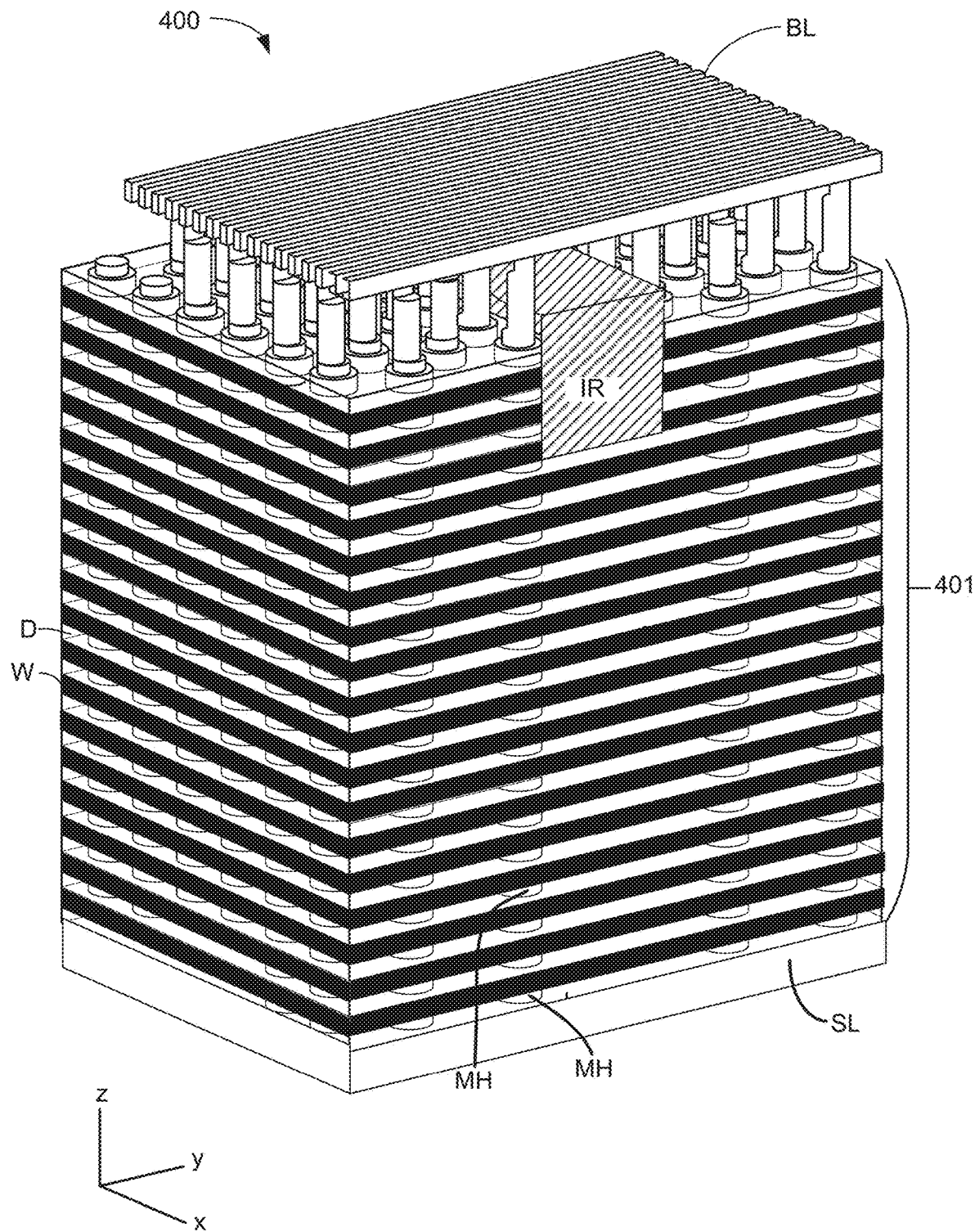
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
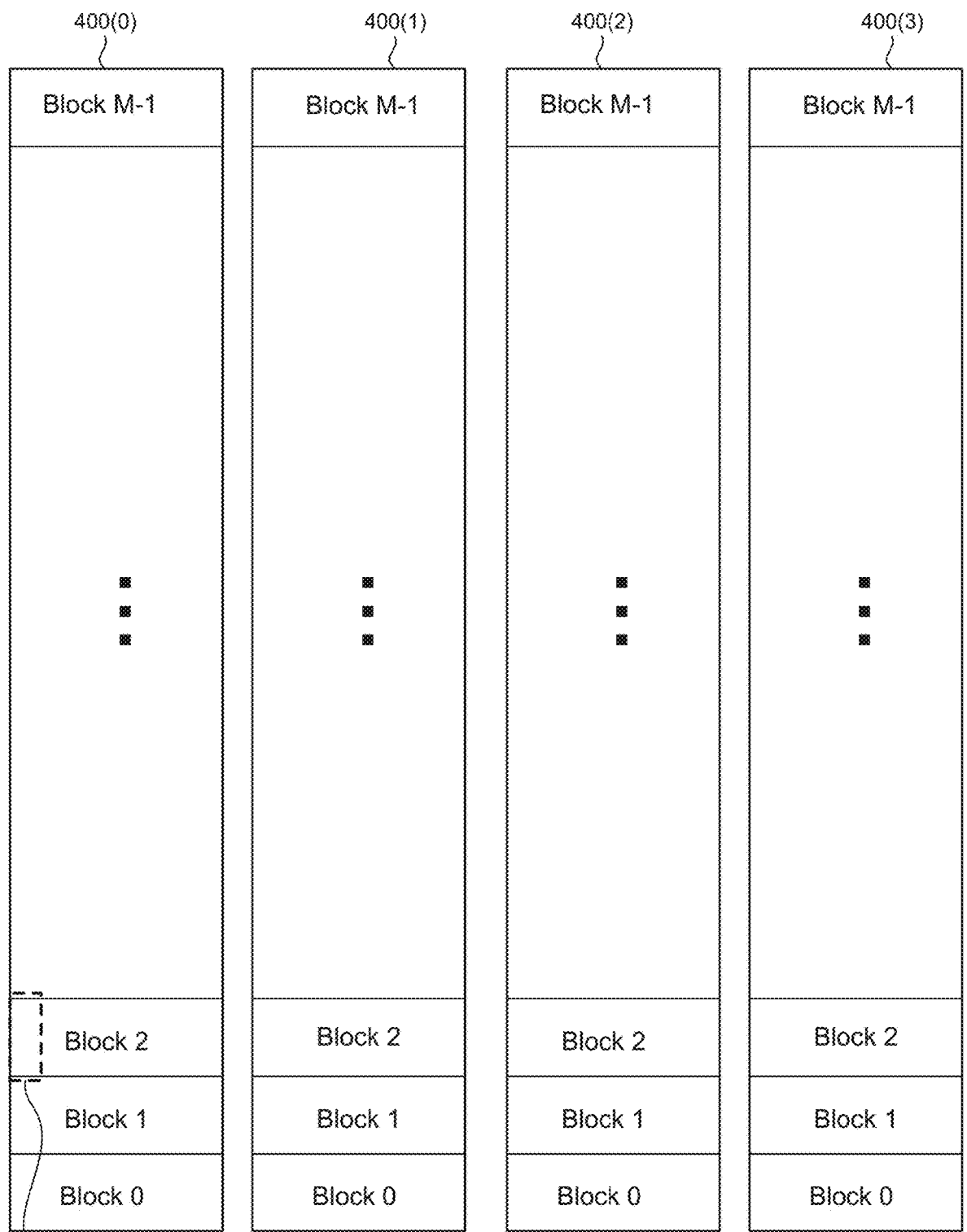
FIG. 4A is a block diagram of one embodiment of a memory structure having four planes.

FIG. 4A is a block diagram explaining one example organization of memory structure 202, which is divided into four planes 400(0), 400(1), 400(2), 400(3). Each plane is then divided into M blocks. In one example, each plane has about 2000 physical blocks. However, different numbers of physical blocks and planes can also be used. In one embodiment, a physical block of memory cells is a unit of erase. That is, all memory cells of a physical block are erased together. In other embodiments, physical blocks can be divided into sub-blocks and the sub-blocks can be the unit of erase. Memory cells can also be grouped into physical blocks for other reasons, such as to organize the memory structure to enable the signaling and selection circuits. In some embodiments, a physical block represents a groups of connected memory cells as the memory cells of a physical block share a common set of word lines. For example, the word lines for a physical block are all connected to all of the vertical NAND strings for that physical block. Although FIG. 4A shows four planes 400(0)-400(3), more or fewer than four planes can be implemented. In some embodiments, memory structure 202 includes eight planes. In some embodiments, erase can be performed in parallel in the four planes 400(0)-400(3). For example, one block in each plane may be selected for erase in a parallel multi-block erase. Because the blocks being erased are on different planes, this could also be referred to as a multi-plane erase.

Figure 4B:
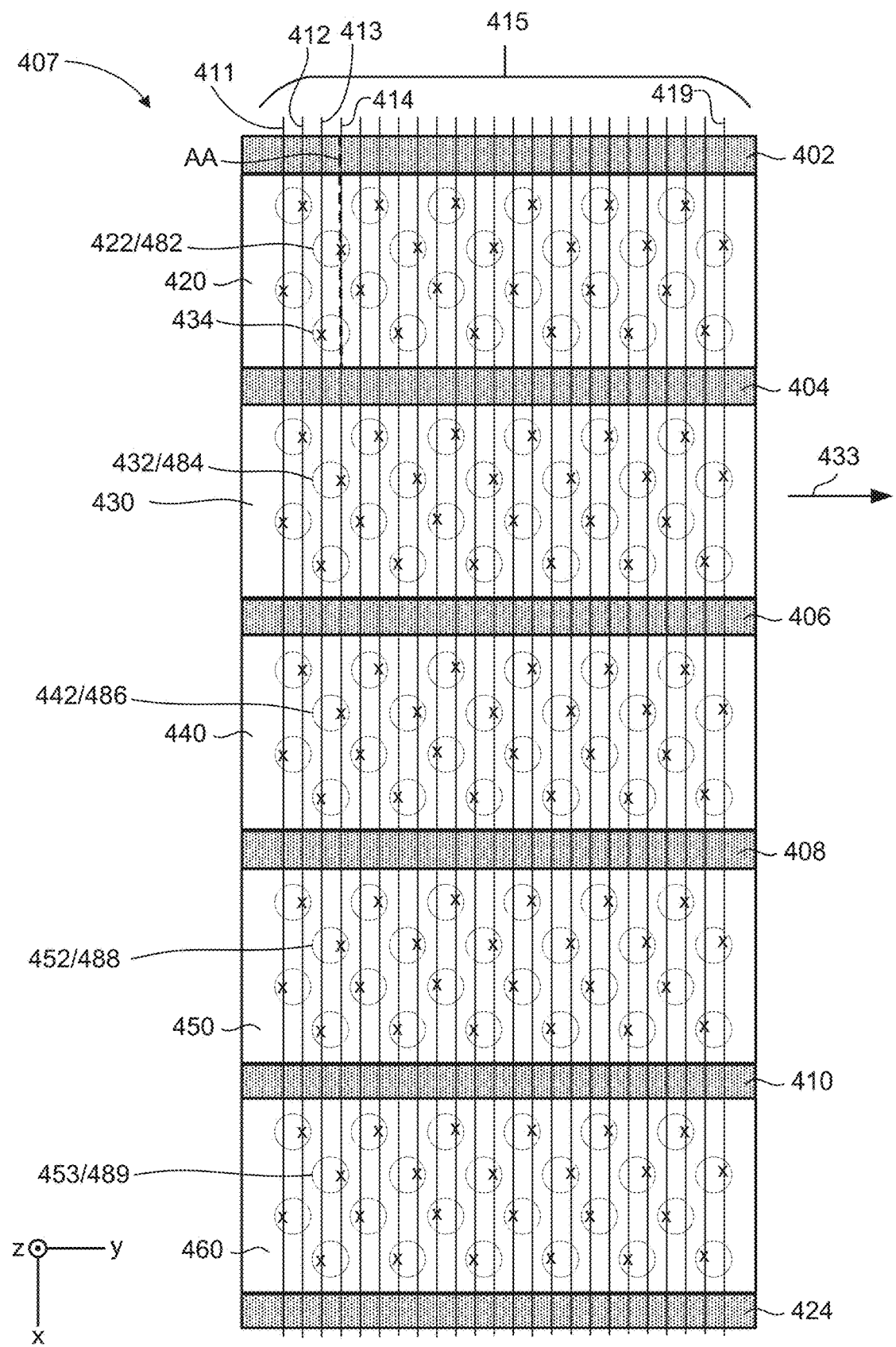
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a block diagram depicting a top view of a portion 407 of Block 2 in plane 400(0). As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452, and 453. Vertical column 422 implements NAND string 482. Vertical column 432 implements NAND string 484. Vertical column 442 implements NAND string 486. Vertical column 452 implements NAND string 488. Vertical column 453 implements NAND string 489. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442, 452, and 453.

The block depicted in FIG. 4B includes a set of isolation regions 402, 404, 406, 408, 410, and 424, which are formed of $SiO_2$; however, other dielectric materials can also be used. Isolation regions 402, 404, 406, 408, 410, and 424 serve to divide the top layers of the block into five regions; for example, the top layer depicted in FIG. 4B is divided into regions 420, 430, 440, 450, and 460 of which are referred to as sub-blocks. In one embodiment, isolation regions 402 and 424 separate the block from adjacent blocks. Thus, isolation regions 402 and 424 may extend down to the substrate. In one embodiment, the isolation regions 404, 406, 408, and 410 only divide the layers used to implement select gates so that NAND strings in different sub-blocks can be independently selected. Referring back to FIG. 4, the IR region may correspond to any of isolation regions 404, 406, 408 or 410. In one example implementation, a bit line only connects to one vertical column/NAND string in each of regions (sub-blocks) 420, 430, 440, 450 and 460. In that implementation, each block has twenty rows of active columns and each bit line connects to five vertical columns/NAND strings in each block. In one embodiment, all of the five vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region having four rows of vertical columns, five regions and twenty rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
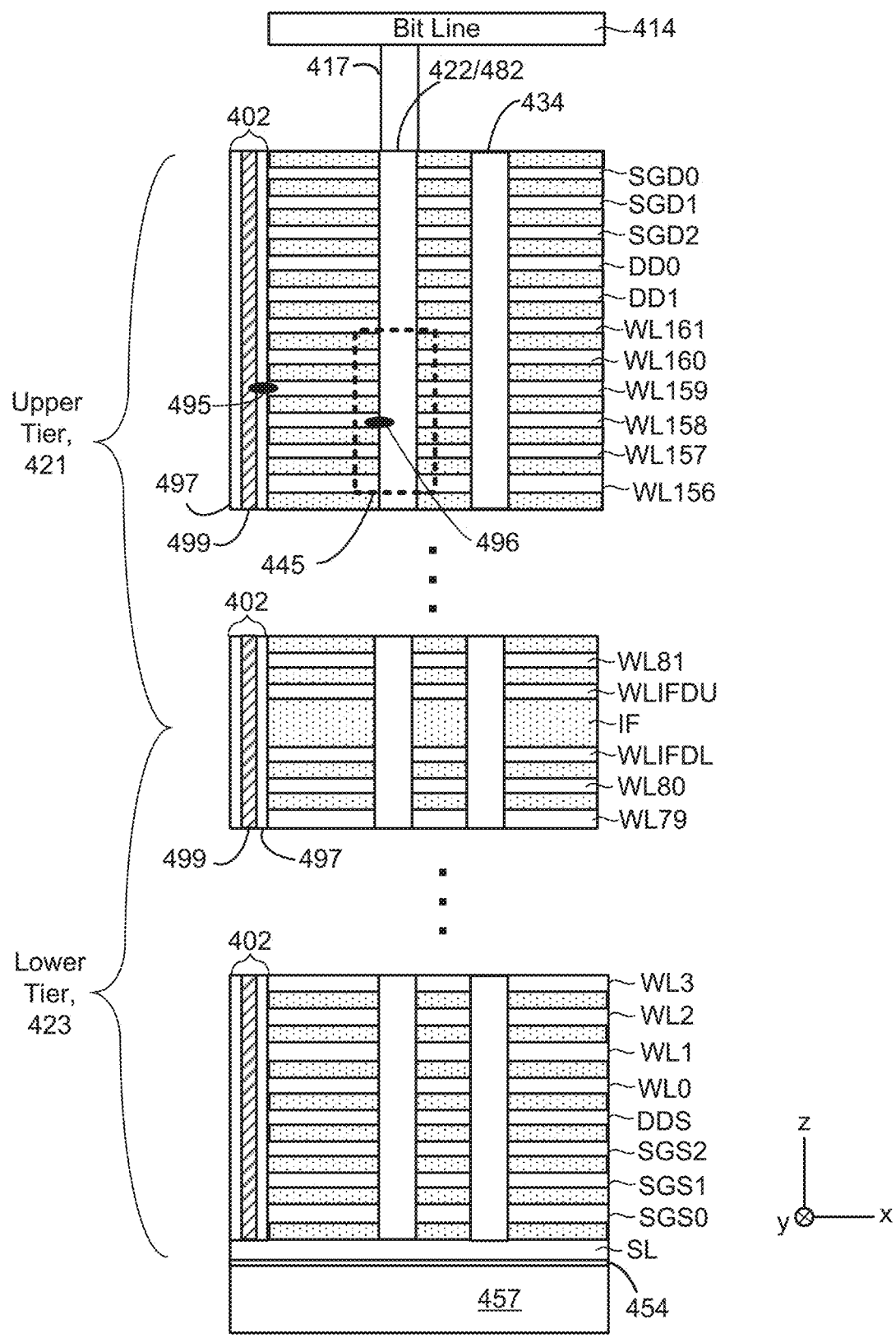
FIG. 4C depicts an embodiment of a stack showing a cross-sectional view along line AA of FIG. 4B.

FIG. 4C depicts a portion of one embodiment of a three dimensional memory structure 202 showing a cross-sectional view along line AA of FIG. 4B. This cross sectional view cuts through vertical columns (NAND strings) 422 and 434 of region 420 (see FIG. 4B). The structure of FIG. 4C includes three drain side select gate layers (SGD0, SGD1 and SGD2). The structure of FIG. 4C also includes three source side select gate layers (SGS0, SGS1 and SGS2). The structure of FIG. 4C also includes five dummy word line layers DD0, DD1, WLIFDU, WLIDDL, DDS; one hundred sixty two word line layers WL0-WL161 for connecting to data memory cells. Dielectric layers are depicted between the conductive layers just described. Other embodiments can implement more or fewer than the numbers described above for FIG. 4C. In one embodiment, SGD0, SGD1 and SGD2 are electrically connected together; and SGS0, SGS1 and SGS2 are electrically connected together.

FIG. 4C depicts an embodiment of a stack having two tiers. The two-tier stack comprises an upper tier 421 and a lower tier 423. A two-tier other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the upper tier 421 and the lower tier 423 are erased independent of one another. Hence, data may be maintained in the lower tier 423 after the upper tier 421 is erased. Likewise, data may be maintained in the upper tier 421 after the lower tier 423 is erased.

Vertical columns 432 and 434 are depicted protruding through the drain side select layers, source side select layers, IF layer, dummy word line layers and word line layers. In one embodiment, each vertical column comprises a vertical NAND string. Below the vertical columns and the layers listed below is substrate 457, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to bit line 414 via connector 417.

One of the isolation regions 402 is depicted adjacent to the stack, in agreement with FIG. 4B. The isolation region 402 has a conductive region 499 surrounded by an insulating material 497. The conductive region 499 extends down to the source line (SL) and provides operating voltages to the SL. In one embodiment, an erase voltage is provided by way of conductive region 499 to the SL. The conductive region 499 may be formed from, for example, tungsten. The conductive region 499 may be referred to herein as a local interconnect (LI). The insulating material 497 may be formed from, for example, silicon oxide. It is possible for a short circuit to occur between a word line and the conductive region 499. An example defect 495 that results in a short circuit between WL159 and the conductive region 499 is depicted. Defects such as defect 495 may be present when the memory structure is manufactured or may develop as a result of normal memory operations.

Another type of short circuit that may be present is a word line to memory hole short circuit. Defect 496 may result in a short circuit between WL158 and the memory hole 422. Defects such as defect 496 may be present when the memory structure is manufactured or may develop as a result of normal memory operations. Short circuits such as, but not limited to those that result from defects 496, 495 may result in leakage current during memory operations such as read, program and erase. As will be discussed in further detail below, leakage currents during erase could result in a severe reduction in the magnitude of the erase voltage, which can impair erase operations. Such leakage current may be especially problematic when erasing multiple erase blocks in parallel. While leakage currents are one example of a problem that can lead to an erase to fail other problems can also lead to erase failure.

For ease of reference, drain side select layers, source side select layers, dummy word line layers, and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W161 connect to memory cells (also called data memory cells). Dummy word line layers DD0, DD1 and DDS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect (or cut off) the channels of respective NAND strings from bit lines. Source side select layers SGS0, SGS1, and SGS2 are used to electrically connect and disconnect (or cut off) the channels of respective NAND strings from the source line SL.

Figure 4D:
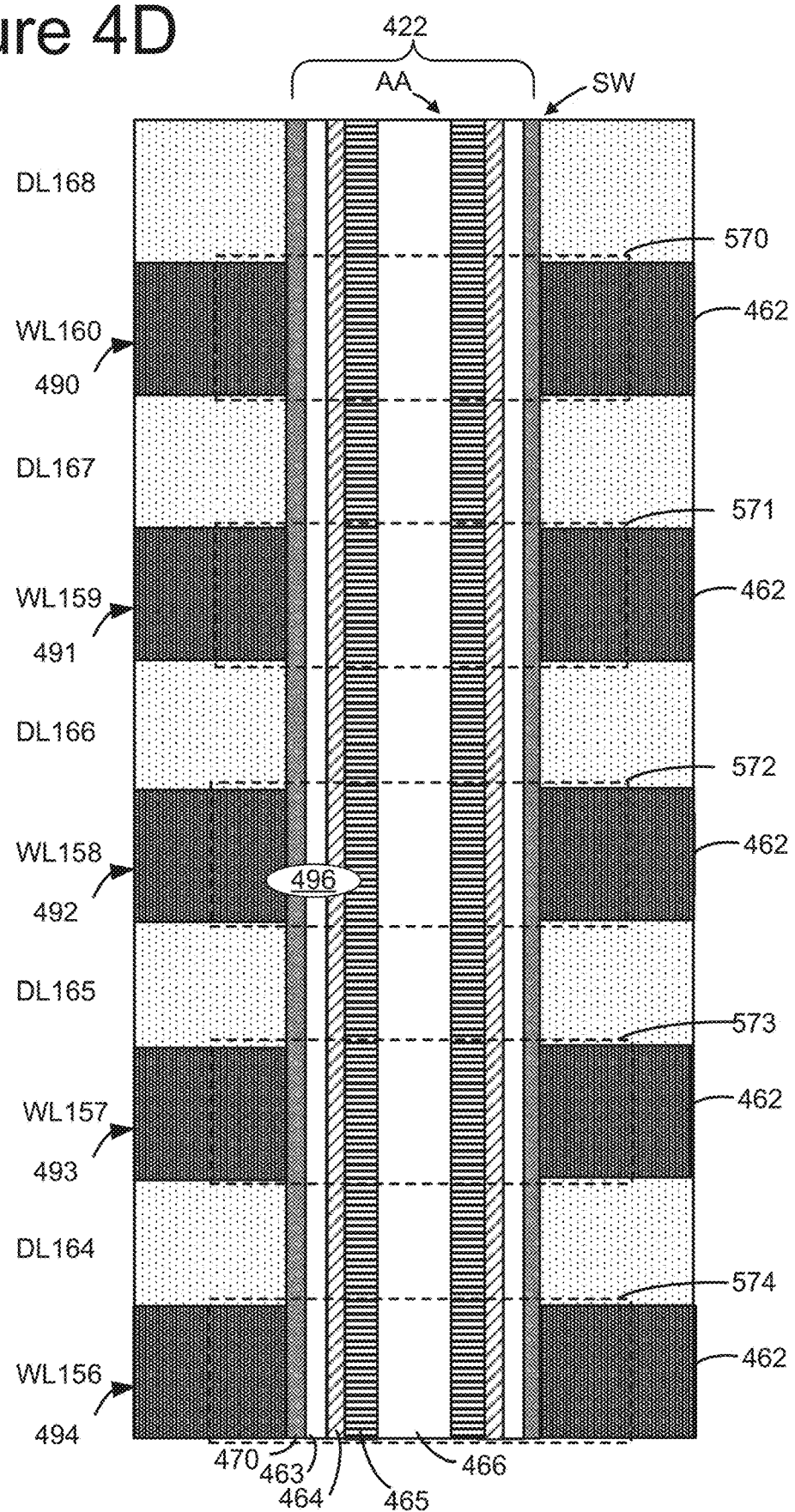
FIG. 4D depicts a view of the region 445 of FIG. 4C.

FIG. 4D depicts a view of the region 445 of FIG. 4C. Included are WL156-160 and dielectric layers DL164-DL168. Data memory cell transistors 570, 571, 572, 573, and 574 are indicated by the dashed lines. A number of layers can be deposited along the sidewall (SW) of the memory hole 422 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

As mentioned above, one type of short circuit that may be detected is a word line to memory hole short circuit. Defect 496 may result in a short circuit between WL158 and one or more of the layers in the memory hole 422 such as, for example, charge-trapping layer 463 and/or polysilicon body 465. In one embodiment, such word line to memory hole short circuits are detected early during an erase procedure of multiple erase blocks.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
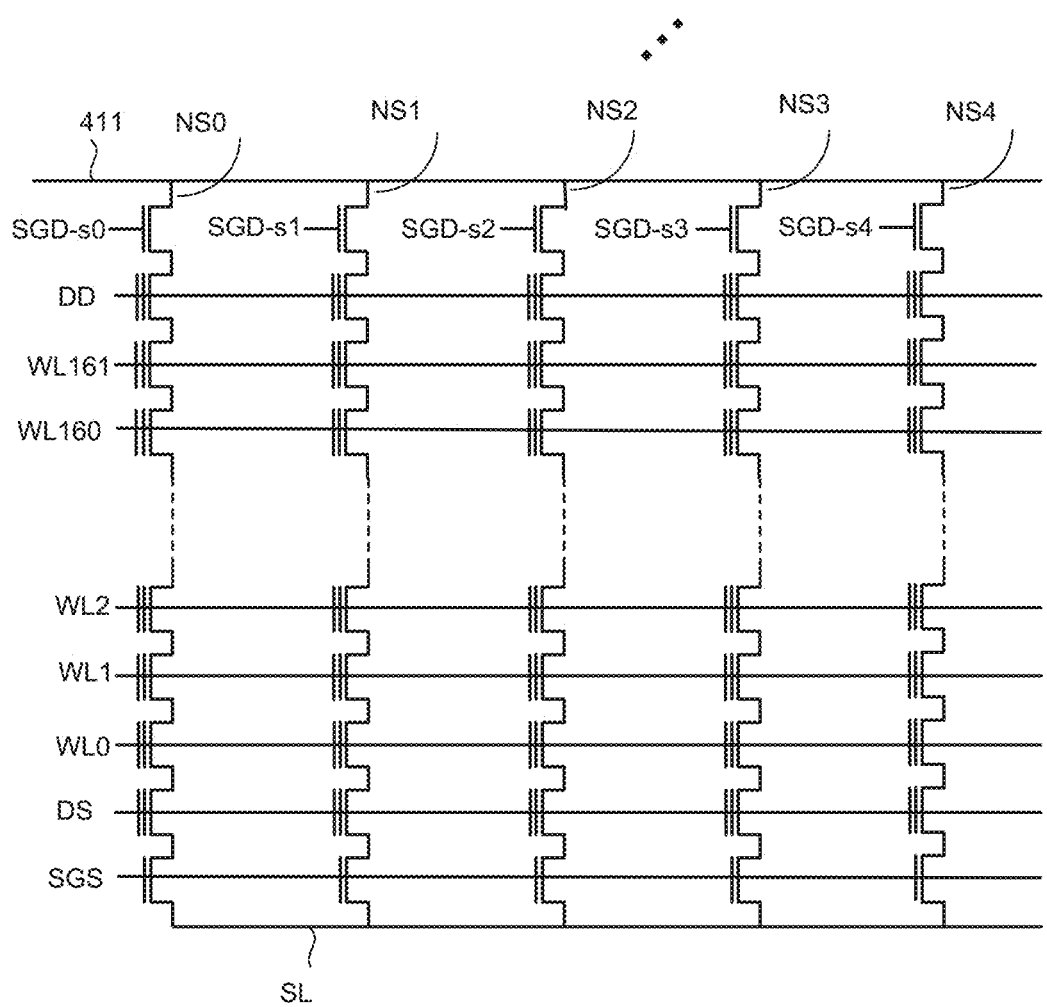
FIG. 4E is a schematic diagram of a portion of one embodiment of a block, depicting several NAND strings.

FIG. 4E is a schematic diagram of a portion of the memory depicted in in FIGS. 4-4D. FIG. 4E shows physical word lines WL0-WL161 running across the entire block. The structure of FIG. 4E corresponds to portion 407 in Block 2 of FIGS. 4A-4B (only bit line 411 is depicted in FIG. 4E). Within the block, each bit line is connected to five NAND strings. Drain side selection lines SGD-s0, SGD-s1, SGD-s2, SGD-s3 and SGD-s4 are used to determine which of the five NAND strings (NS0, NS1, NS2, NS3, NS4) connect to the associated bit line. Other NAND strings of the block and other bit lines are not depicted in FIG. 4E. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. There may be more or fewer than five sub-blocks in a block.

A source side selection line SGS connects/disconnects the NAND strings to/from the common source line. In some embodiments, there is a source side selection line for each sub-block (similar to the five SGD-s0, SGD-s1, SGD-s2, SGD-s3 and SGD-s4). The block can also be thought of as divided into five sub-blocks SB0, SB1, SB2, SB3, SB4. Sub-block SB0 corresponds to those vertical NAND strings controlled by SGD-s0, Sub-block SB1 corresponds to those vertical NAND strings controlled by SGD-s1, Sub-block SB2 corresponds to those vertical NAND strings controlled by SGD-s2, Sub-block SB3 corresponds to those vertical NAND strings controlled by SGD-s3, and Sub-block SB4 corresponds to those vertical NAND strings controlled by SGD-s4.

Although the example memories of FIGS. 4-4E are three dimensional memory structure that includes vertical NAND strings with charge-trapping material, other (2D and 3D) memory structures can also be used with the technology described herein.

The memory systems discussed above can be erased, programmed and read. Each memory cell may be associated with a memory state according to write data in a program command. Based on its memory state, a memory cell will either remain in the erased state or be programmed to a memory state (a programmed memory state) different from the erased state.

For example, in a two-bit per cell memory device (sometimes referred to as a multi-level cell (MLC)), there are four memory states including the erased state and three programmed memory states referred to as the A, B and C memory states. In a three-bit per cell memory device (sometimes referred to as a tri-level cell (TLC)), there are eight memory states including the erased state and seven programmed memory states referred to as the A, B, C, D, E, F and G memory states. In a four-bit per cell memory device (sometimes referred to as a quad-level cell (QLC)), there are sixteen memory states including the erased state and fifteen programmed memory states referred to as the Er, S1, S2, S3, S4, S5, S6, S7, S8, S9, S10, S11, S12, S13, S14 and S15 memory states.

FIG. 5A depicts an embodiment of threshold voltage Vth distributions for a four-state memory device in which each memory cell stores two bits of data. A first threshold voltage Vth distribution 500 is provided for erased (Er-state) storage elements. Three threshold voltage Vth distributions 502, 504 and 506 represent programmed memory states A, B and C, respectively. A 2-bit code having lower and upper bits can be used to represent each of the four memory states. In an embodiment, the "Er," "A," "B," and "C" memory states are respectively represented by "11," "01," "00," and "10."

FIG. 5B depicts an embodiment of threshold voltage Vth distributions for an eight-state memory device in which each memory cell stores three bits of data. A first threshold voltage Vth distribution 510 is provided for Er-state storage elements. Seven threshold voltage Vth distributions 512, 514, 516, 518, 520, 522 and 524 represent programmed memory states A, B, C, D, E, F and G, respectively. A 3-bit code having lower page, middle page and upper page bits can be used to represent each of the eight memory states. In an embodiment, the "Er," "A," "B," "C," "D," "E," "F" and "G" memory states are respectively represented by "111," "011," "001," "000," "010," "110," "100" and "101."

FIG. 5C depicts an embodiment of threshold voltage Vth distributions for a sixteen-state memory device in which each memory cell stores four bits of data. A first threshold voltage Vth distribution 530 is provided for erased Er-state storage elements. Fifteen threshold voltage Vth distributions 532, 534, 536, 538, 540, 542, 544, 546, 548, 550, 552, 554, 556, 558 and 560 represent programmed memory states S1, S2, S3, S4, S5, S6, S7, S8, S9, S10, S11, S12, S13, S14 and S15, respectively.

A 4-bit code having lower page, middle page, upper page and top page bits can be used to represent each of the sixteen memory states. In an embodiment, the S0, S1, S2, S3, S4, S5, S6, S7, S8, S9, S10, S11, S12, S13, S14 and S15 memory states are respectively represented by "1111," "1110," "1100," "1101," "1001," "0001," "0101," "0100," "0110," "0010," "0000," "1000," "1010," "1011," "0011," and "0111," respectively.

The technology described herein also can be used with other types of programming in addition to full sequence programming (including, but not limited to, multiple stage/phase programming). In some embodiments, programmed states (e.g., S1-S15) can overlap, with controller 120 (FIG. 1) relying on error correction to identify the correct data being stored.

In one embodiment memory cells are erased prior to programming, and erasing is the process of changing the threshold voltage of one or more memory cells from a programmed data state to an erased data state. For example, changing the threshold voltage of one or more memory cells from states A-C to state E of FIG. 5A, from states A-G to state Er of FIG. 5B, or from states S1-S15 to state Er of FIG. 5C.

Figure 6:
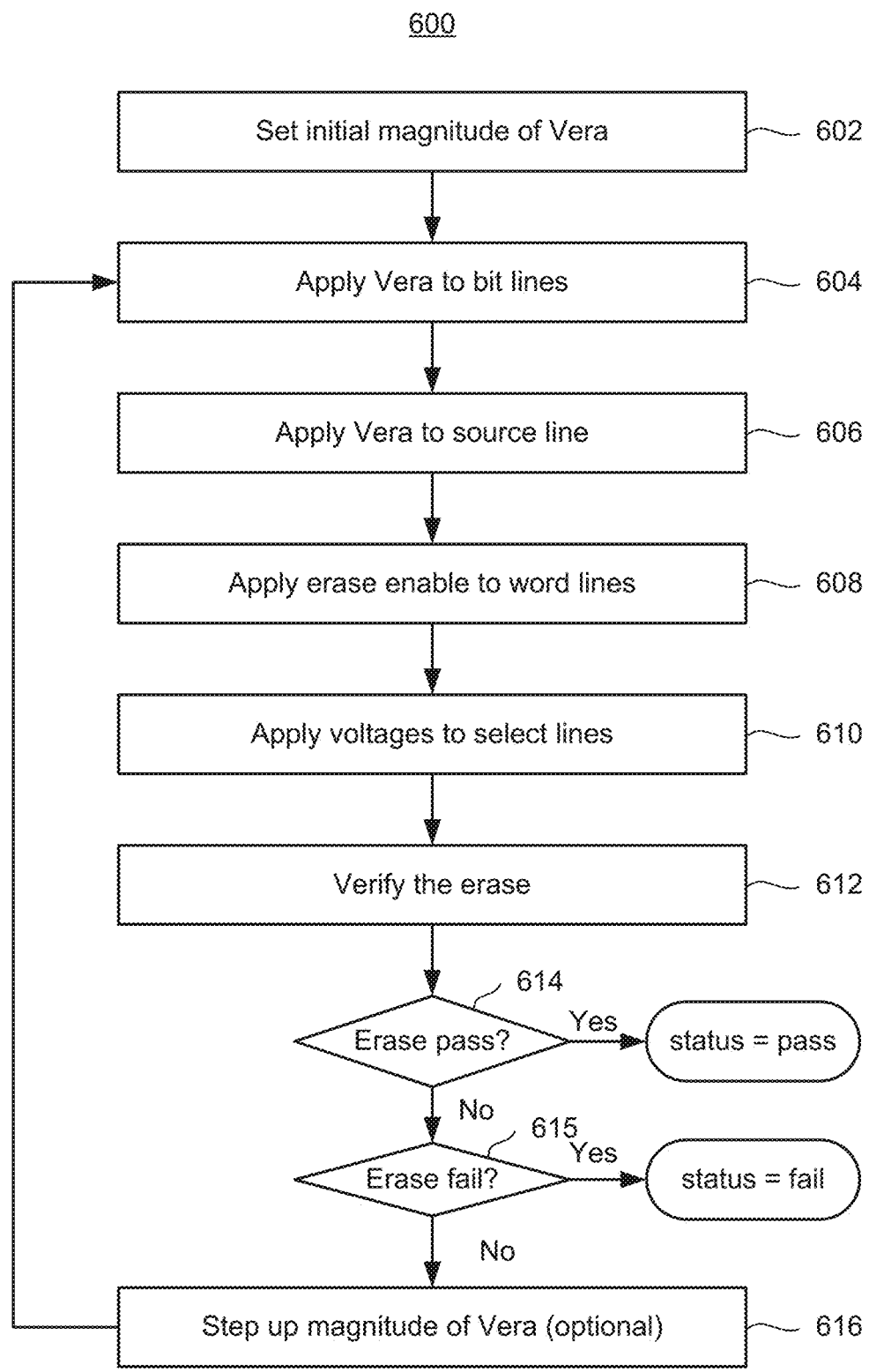
FIG. 6 is a flowchart describing one embodiment of a process for erasing memory cells.

FIG. 6 is a flowchart describing one embodiment of a process 600 for erasing memory cells. The process 600 may be used to erase an erase block of NAND memory cells. In one embodiment, the process 600 may be used to erase an entire physical block of NAND memory cells. In one embodiment, the process 600 may be used to erase a sub-block of the physical block of NAND memory cells. One type of sub-block are the sub-blocks selected by different select lines such as in FIG. 4E. For example, the sub-block selected by SGD-s0 may be erased independent of the other four sub-blocks. Thus, in the example in FIG. 4E, there may be five sub-blocks selected by the respective SGDs. Another type of sub-block may be referred to as tiers, as depicted in FIG. 4C. In the example in FIG. 4C, upper tier 421 is in one erase block and lower tier 423 is in another erase block. The sub-block concepts in FIGS. 4C and 4E can be combined to form erase blocks. In an embodiment, system control logic 260 performs process 600 in response to a command from the memory controller 120. Process 600 describes a double sided erase in which an erase voltage (Vera) is applied at both ends of NAND strings (e.g., bit lines and source line). A variant is to perform a single sided erase in which the erase voltage is applied to only one end of the NAND strings. The process 600 may be performed in parallel on different erase blocks, which may be in different planes on the same memory die.

Step 602 includes setting an initial magnitude of an erase voltage (Vera). The initial Vera may have a relatively large magnitude such as, for example, 20V. Step 604 includes applying Vera to bit lines associated with the erase block. Step 606 includes applying Vera to one or more source lines associated with the erase block. Step 608 includes applying an erase enable to the word lines in the erase block. In one embodiment, the erase enable voltage is 0V. Step 610 includes applying a select voltage to select lines (e.g., SGD, SGS). The select voltage allows Vera to pass to the NAND channels.

Thus, the erase of a memory cell includes applying an erase enable voltage (e.g., 0V) to the control gate of the memory cell while applying an erase voltage Vera (e.g., about 20V) to a channel or body of the memory cell. An erase voltage is defined herein as a voltage applied to a channel or body of a memory cell that will erase the memory cell providing that the erase enable voltage is also applied to a control gate of that memory cell. A memory cell that has the erase voltage applied to its channel (body) may be inhibited from erase by applying an erase inhibit voltage (e.g., the erase voltage or about 20V, but the erase inhibit voltage could have a lower magnitude, such as around 5V or so less for example) to its control gate. An erase inhibit voltage is defined herein as a voltage that will inhibit erase of a memory cell despite the erase voltage being applied to a channel of that memory cell. For example, an erase inhibit voltage may be applied to dummy word lines so that their state of programming is unchanged. Also, in some embodiments of NAND memory, such as the structures described above with respect to FIGS. 4A-4E, the select gates may include a charge storing region similar to the memory cells and, to avoid changing the select gates' threshold voltages, the select gates can similarly be biased at the erase inhibit voltage.

One technique to erase memory cells is to bias a p-well substrate to a high voltage to charge up a NAND channel. An erase enable voltage is applied to control gates of memory cells while the NAND channel is at a high voltage to erase the memory cells. In one embodiment, a p-well erase is performed. In some cases, the NAND strings within a block may share a common well (e.g., a p-well). In a p-well erase, holes may be provided from the p-well in the substate below the NAND strings. In one embodiment, memory cells may be erased by raising the p-well to an erase voltage (e.g., 20 volts) for a sufficient period of time and grounding the word lines connected to memory cells to be erased. These erase bias conditions may cause electrons to be transferred from the charge-trapping layer or film 463 through the tunneling oxide 464, thereby lowering the threshold voltage of the memory cells within the selected block.

Another approach to erasing memory cells is to generate gate induced drain leakage (GIDL) current to charge up the NAND string channel. An erase enable voltage is applied to control gates of the memory cells, while maintaining the string channel potential to erase the memory cells. The GIDL current is generated by causing a drain-to-gate voltage at a select transistor (drain side and/or source side), in one embodiment. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel 465, thereby raising the potential of the channel 465. The other type of carriers, e.g., electrons, are extracted from the channel 465, in the direction of a bit line or in the direction of a source line, by an electric field. During erase, the holes may tunnel from the channel to a charge storage region 463 of memory cells and recombine with electrons there, to lower the threshold voltage of the memory cells.

After steps 604-610 are performed, an erase verify may be performed in step 612. The erase verify may apply for example VvEr (See FIGS. 5A-5C) to each data WL in the erase block. If all memory cells in the erase block on a given NAND string have a Vt below VvEr then the NAND string will conduct a significant current. Note that if only one tier is being erased then a pass voltage may be applied to word lines in the tier that is not being erased. The pass voltage is a voltage having sufficient magnitude to be above the respective Vts of the memory cells in the tier not being erased. In some embodiments, if a NAND string passes erase of the NAND string may end at this point. Step 614 is a determination of whether erase is complete. If erase has passed then the process 600 completes with a status of pass. If erase has not yet passed then a determination may be made in step 615 of whether erase has failed. In one embodiment, the erase process is allowed a certain number of loops to complete and if erase does not pass within the allowed number, then the status is "fail." However, another test can be performed to determine an erase fail such as whether a certain data state (e.g., the A-state) has completed programming within an allowed number for that data state. If the erase has not failed, then the magnitude of the erase voltage may optionally be increased in step 616. Thus, steps 604-615 are repeated.

Process 600 describes a double-sided erase in which Vera is applied to both ends of the NAND strings (bit lines and source line(s)). One embodiment is a single-side erase in which Vera is applied to the bit lines but not to the source line(s). One embodiment is a single-side erase in which Vera is applied to the source line(s) but not to the bit lines.

During the operation of a non-volatile memory device, defects ("grown" defects) will often develop or worsen over time, often characterized as defective parts per million (DPPM). To determine such defects, the memory device can include test modes at part of operations to test for various failure mechanism. In a flash NAND memory, these are often performed to determine defects at the block level.

Figure 7:
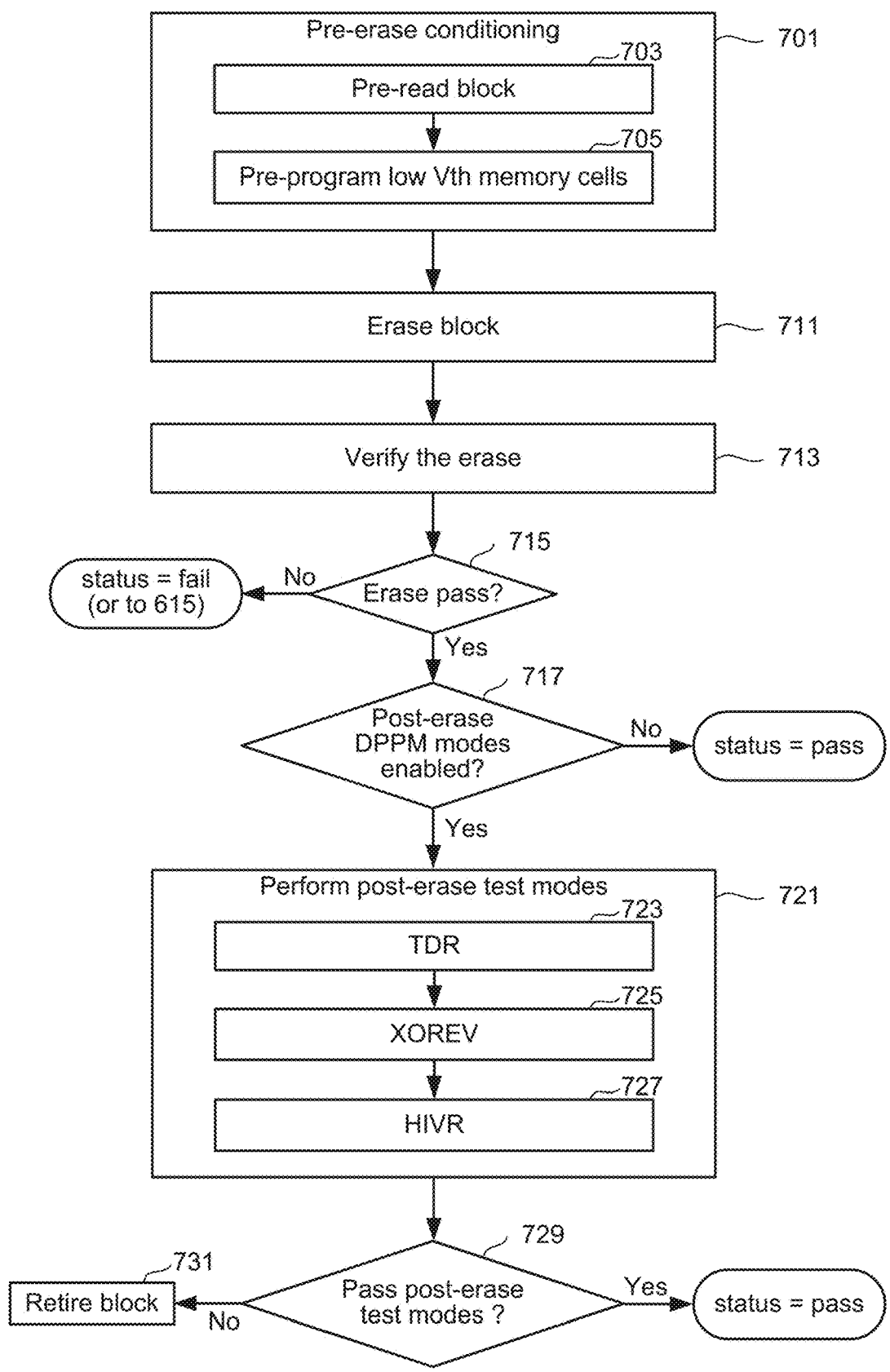
FIG. 7 is a flowchart describing one embodiment for incorporating post-erase defect testing into the process for erasing memory cells.

The following discussion considers the inclusion of post-erase failure detection modes into the erase process to lower the number of defects at the system level and for users. The tests can be triggered as part of the erase operation, following the erase verify operation, to detect defects that may have occurred, but still resulted in a pass status for the erase. Although these operations can lower performance, they can reduce the number of defective memory blocks in use by detecting grown defects. FIG. 7 is a flow chart illustrating an embodiment for, if enabled, automatically invoking post-erase defected detection modes once an erase verify finishes.

FIG. 7 is a flowchart describing one embodiment for incorporating post-erase defect testing into the process for erasing memory cells. The embodiment of FIG. 7 begins with an optional pre-erase conditioning at step 701. The pre-erase conditioning can be used to provide a more well-defined distribution of erased state thresholds by putting the memory cells in a more uniform condition prior to the erase. For example, a block selected for erase can undergo a pre-read at step 703 to determine memory cells that were previously left in the erased state or programmed to one of the lower threshold voltage states. In one embodiment, this is only at a single read voltage to determine any of the memory cells at these low lying states. At step 705 the lower Vth memory cells can be pre-programmed to raise their Vth values to provide a more uniform starting point for erase. This can be a simplified program operation, such as only using a single verify level or even dispensing with the program verify and applying one or more program pulses to the low threshold memory cells without intervening sensing operations.

At step 711 the block is then erased, followed by erase verification at step 713, and then determine whether the block passes the erase verify at step 715. These steps can be a version of FIG. 6 as described above, where step 711 can correspond to steps 602-610, step 713 can correspond step 612, and step 715 can correspond to step 614. FIG. 7 is also simplified in that it omits the additional test of step 615 and step 616 looping back for an additional erase pulse. More specifically, at step 715, if the block does not pass the erase verify, the blocks status is either set to fail or, in an embodiment with multiple erase pulses with verifies in between, the flow can loop back to the equivalent of a step 615. If the block passes the erase verify at step 715, the flow then continues on to determine whether the post-erase defect detection test modes are enabled.

Step 717 determines whether the post-erase defect test modes are enabled. Whether or not the post-erase defect test modes are enabled and the conditions for being enabled can vary depending upon the embodiment. For example, enablement can be user selectable, allowing the user to select between performance and maintaining a lower DPPM value for the memory device. In other cases, such tests can be performed periodically, enabled by the system control logic 260 or memory controller 120 based on factors such as the number of erases since the tests were last performed, the number of program/erase cycles the block has experienced, in response to operating error, or combinations of these and other factors. If the post-erase defect test modes are not enabled, a pass status is returned and the memory block remains in the good block pool. If the post-erase defect test modes are enabled, these are performed at step 721.

The post-erase test modes are performed at step 721, where the number and types of tests, and order in which they are performed, can vary based on the embodiment. Additionally, in some embodiments, step 717 can enable, or not, the different tests independently. The example of FIG. 7 includes three modes: TDR, a read to detect whether the distribution of threshold voltages for the select gates have developed a tail; XOREV, where the even and odd word lines are verified separately and compared; and HIVR, a read to check for leaks between word lines and memory holes. These test mode are discussed in more detail below. Step 729 determines whether or not the block passes the tests of step 721 and, if not, the block is retired at step 731. If the block passes at step 729, a pass status is returned and the block remains in the pool of good blocks.

In the erase verify of step 713 or 612, the memory cells of the selected block are read to see whether their voltage thresholds are below the erase verify level VvEr, as illustrated in FIGS. 5A-5C. In a standard data read or program verify, the memory cells have their threshold voltages measured individually to see whether it is above a read or verify voltage level. In the erase verify case, the memory cells are sensed to determine whether they are all below the erase verify level. Additionally, in the erase verify sensing, since the state of the memory cells are being verified at the block level to see whether they are below VvEr, multiple word lines—typically all—of a block can be erased verified concurrently. The post-erase test modes at steps 723, 725, and 727 also involve sensing operations, but can use differing bias conditions that can target particular defects.

The TDR (tail detect read) test of step 723 is directed at determining whether the threshold voltages of the select gates of the NAND strings have drifted too far from their desired values, developing a tail in their Vth distribution. For proper operation of a NAND string of memory cells, the select gates at the source and drain ends of each NAND string need to be able to reliably be put in either an on state or an off state. Consequently, the threshold distributions of the transistors used to implement the selected gates need to be relatively tight, without significant tails, since a select gate with too high a Vth could not be turned on with the standard select gate on voltage and a select with too a low a Vth could not be turned off with the low value for the select gate voltages. Particularly in embodiments, such as in the 3D NAND structures described above, where some or all of the select gates have a charge trapping region similarly to the memory cells, the Vth of some select gates may drift over time to result in a grow defect or may also have their threshold voltage lowered too much during erase operations. The TDR test mode of step 723 can be used to detect these failure modes by, essentially, performing a read process on the select gates. This can be done to both check that a select gate's Vth is not too high and is not to low, but, as a distribution tail is more commonly found on the lower end, the following embodiments described with respect to FIG. 8 only checks for a lower tail, although other embodiments can also check at the upper end.

Figure 8:
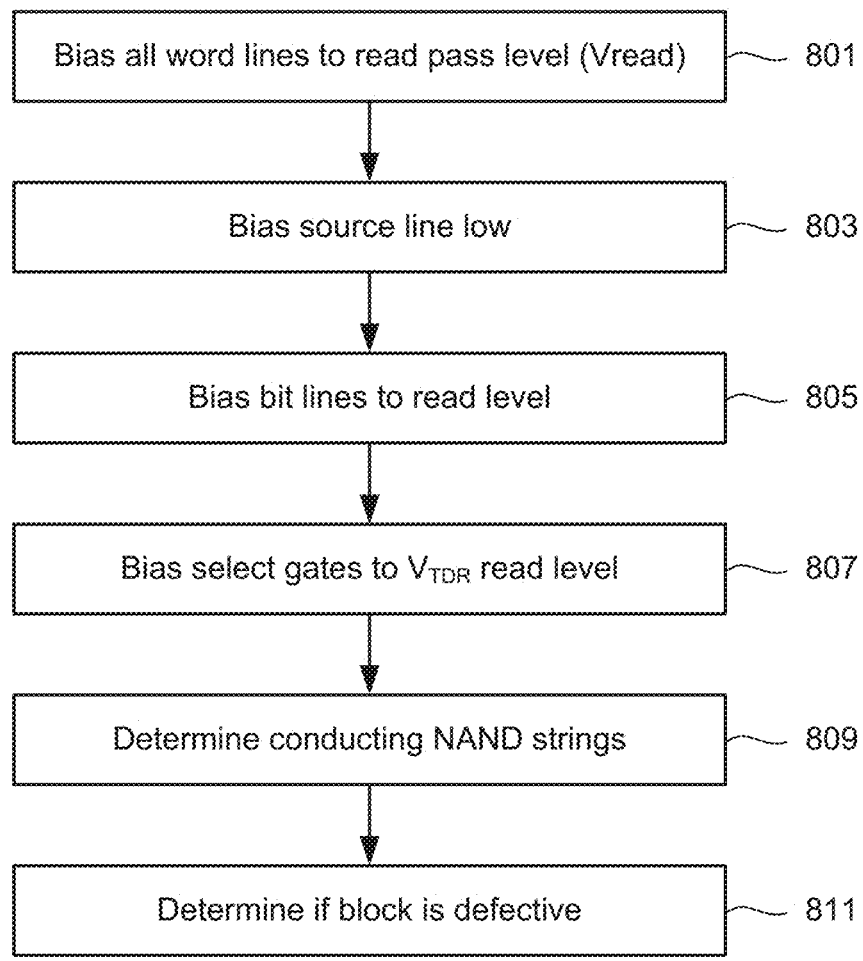
FIG. 8 is a flow chart for post-erase defect detection mode to determine whether threshold voltages of the select gates of a block have become outside of the desired range.

FIG. 8 is a flow chart for post-erase defect detection mode to determine whether threshold voltages of the select gates of a block have become outside of the desired range. The process is similar to a read for the word lines, except it is the select gates threshold voltages that are being sensed. At step 801 all of the word lines are biased at the read pass voltage, Vread, used for non-selected word lines in the read process. In some embodiments, a lower voltage, such as the erase verify voltage, may be used as block has previously passed erase verified. The source is biased low (e.g., 0V) at step 803 and the bit lines biased by a read operation voltage at step 805, as in a normal read or verify operation.

At step 807 the select gates are biased to a tail detect read voltage level ($V_{TDL}$), where this can be a standard select gate voltage off voltage (i.e., 0V or other low voltage level) or a voltage somewhat above the standard level off level, but still well below the standard on level of Vsg, (e.g., a few tenths of a volt) in order to more accurately determine any select gates in lower tail of the threshold distribution. In one embodiment, the upper and lower select gates can be checked individually for a lower threshold voltage by biasing one at $V_{TDL}$ and the other to be at Vsg and checking whether for NAND strings that conduct, then switching the bias levels and checking again. Alternately, both the source and drain select gates can be set at $V_{TDL}$ and the NAND strings checked to see whether they conduct, which requires only a single sensing operation but only will detect when the select gates on both ends have a lowered threshold voltage.

In an embodiment where the select gates are alternately or additionally tested for an upper tail, the select gates can be biased at a standard select gate voltage Vsg or a voltage somewhat below the standard level (e.g., $V_{read}$) in order to more accurately determine any select gates in an upper tail of the threshold distribution. Since to pass an upper tail detect test mode the select gates must have a voltage threshold below the applied select gate bias level, select gates on both ends will need to be on and therefore can be tested at the same time since if either one is bad, the NAND string will not conduct. These bias levels can be applied by the row control circuitry 220 and column control circuitry 210 concurrently or in various orders until they are all established.

For any of the embodiments, once the block is biased, the sense amplifiers of the read/write circuits can determine which NAND strings conduct and which do not conduct at step 809 based on whether or not the corresponding bit line discharges. If a NAND string is conductive, then the select gates at one or both ends have a lowered voltage threshold and the string is counted as defective. Based on the number of non-conducting strings, the control circuitry of the system control logic 260 (or, alternatively, of memory controller 120), can determine whether or not the block is defective at step 811. For example, if all of the NAND strings do not conduct at step 807, the block passes the TDR test mode. Alternately, some number of defective NAND strings may be allowed, where the limit depends on the embodiment and factors such as ECC capabilities, for example.

The XOREV (XOR erase verify) test of step 725 is directed at determining whether there is current leakage between the word lines and the memory holes. As mentioned above with respect to FIGS. 4C and 4D, defects in a non-volatile memory, such as a short or leak between a word line and a memory hole (e.g., a short or leak between a word line and the channel of a NAND string) can introduce an error into the data being stored. Sometimes such a defect does not appear until after the non-volatile memory has been in use. To prevent failures of the non-volatile memory when in use due to defects that first present during operation by a user, manufacturers of non-volatile memory may include various processes for testing the memory in an effort to detect defects before the non-volatile memory is used to store user data. One test for a leak between a word line and memory hole includes causing all memory cells of a set of NAND strings to be in a common threshold voltage distribution (e.g., in the erased state), performing sensing operations to test whether the memory cells are actually in the common threshold voltage distribution separately for memory cells connected to even word line and memory cells connected to odd word lines, and determining whether the results of the sensing for even word lines matches the sensing for odd word lines. If the results of the sensing for even word lines does not match the sensing for odd word lines, then there may be a short or leak between a word line and a memory hole.

Figure 9:
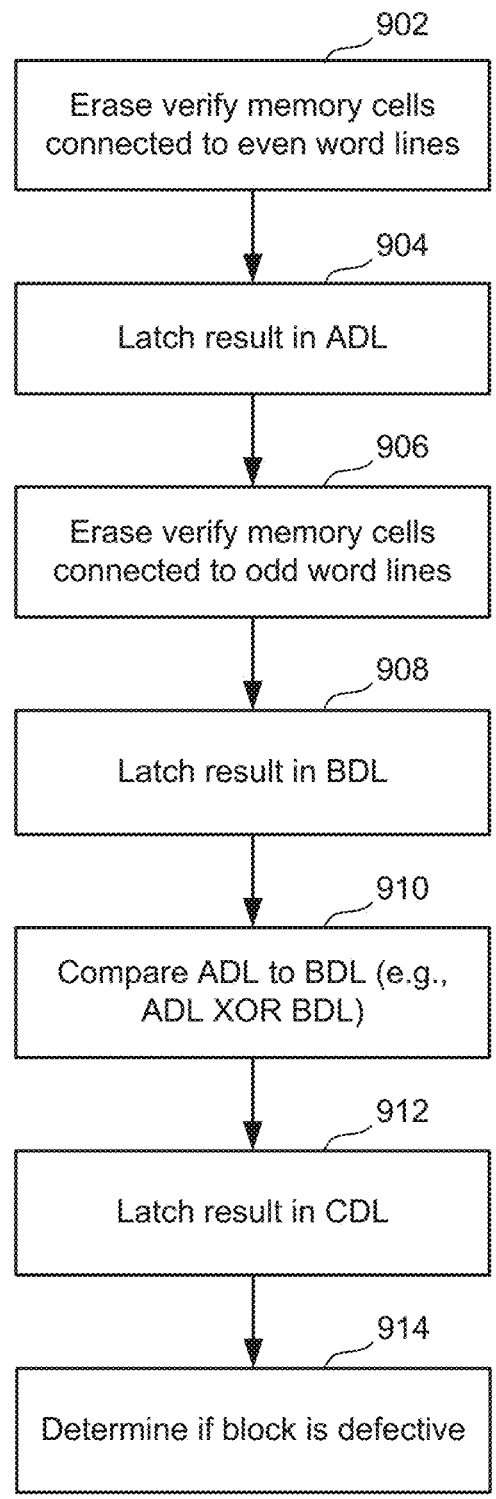
FIG. 9 is a flowchart describing one embodiment of a process for performing post-erase test mode for NAND strings in a block or sub-block and comparing the even word line result from the erase verify for the sub-block to the odd word line result from a post-erase verify for the sub-block.

FIG. 9 is a flowchart describing one embodiment of a process for performing post-erase test mode for NAND strings in a block or sub-block and comparing the even word line result from the erase verify for the sub-block to the odd word line result from a post-erase verify for the sub-block. Thus, the process of FIG. 9 is an example implementation of step 725. Looking back at FIG. 3, the memory system includes a set of latches for each sense amplifier including ADL, BDL, CDL and XDL. In other embodiments, more or less than the four latches can be implemented. The embodiment of FIG. 9 uses three of those latches: ADL, BDL and CDL. In step 902 of FIG. 9, erase verify is performed for memory cells connected even word lines of the current sub-block being operated on. For example, the even word lines (e.g., all even word lines of the block) will receive the erase verify voltage VvEr, the odd word lines will receive the read pass voltage Vread, and the attached sense amplifiers will determine whether current flows in the NAND strings of the sub-block. If so, then the memory cells connected to even word lines have successfully verified. In step 904, the result of the erase verify of step 902 is stored in the latch ADL. For example, if the NAND strings conducted sufficient current during the erase verify such that the memory cells connected to even word lines passed erase verify, then a logic one is stored or latched in ADL. If the NAND strings did not conduct sufficient current during the erase verify, then a logic zero is stored or latched in ADL.

In step 906 of FIG. 9, erase verify is performed for memory cells connected to odd word lines for the sub-block being operated on. For example, the odd word lines (e.g., all odd word liens of the block) will receive VvEr the even word line will receive Vread, and the attached sense amplifiers will determine whether current flows in the NAND strings of the sub-block. If so, then the memory cells connected to odd word lines have successfully verified. In step 908, the result of the erase verify of step 906 is stored in the latch BDL. For example, if the NAND strings conducted sufficient current during the erase verify such that the memory cells connected to odd word lines passed erase verify, then a logic one is stored or latched in BDL. If the NAND strings did not conduct sufficient current during the erase verify, then a logic zero is stored or latched in BDL.

In step 910, the data stored in ADL is compared to the data stored to BDL. In one embodiment processor 330 (see FIG. 3) will perform an exclusive OR (XOR) of ADL and BDL (e.g., ADL XOR BDL). In step 912, the result of the comparison of step 910 is stored (latched) in CDL. In one embodiment, step 912 includes storing logic 0 in CDL if ADL matches BDL and storing logic 1 in CDL if ADL does not match BDL. When the system determines in step 914 whether the block is defective based on the number of NAND strings that have different results is greater than a threshold value, the control circuit can count the number of logic ones in the various CDL latches.

Figure 10:
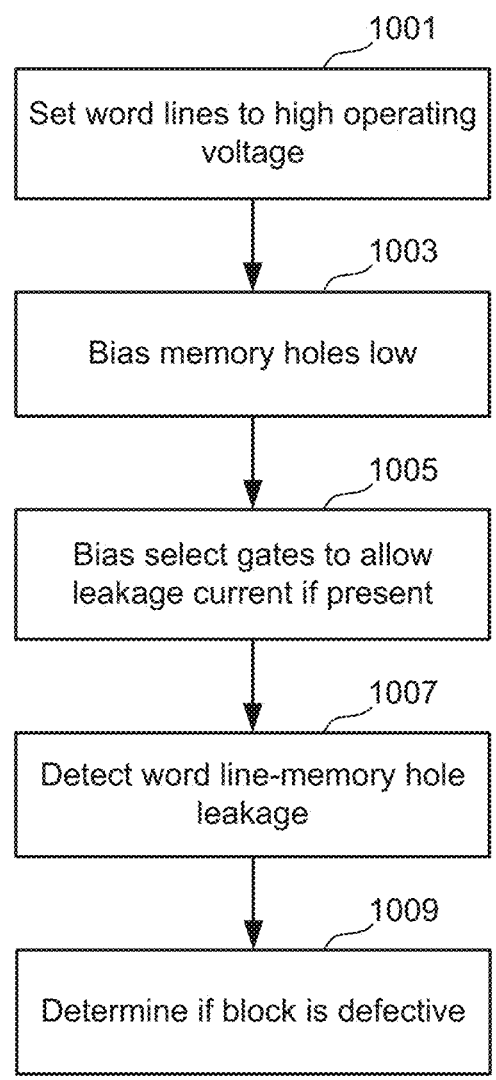
FIG. 10 is a flowchart for an embodiment of a post-erase HIVR test mode.

Returning to FIG. 7, the HIVR test mode of step 727 is also directed at determining whether there is current leakage between the word lines and the memory holes, as this is an important failure mode. In the HIVR test mode the word lines of a block are set at one voltage level, the memory holes through the word lines are biased at another level, and then it is determined whether there is leakage between the word lines and the memory holes. Depending on the embodiment, this can be done either by setting the memory holes (i.e., bit lines) to a higher voltage and the word lines of a block to a lower voltage, or by setting the word lines of the block to a higher voltage and the memory holes to a lower voltage. Since the larger the voltage difference, the easier it is to detect leakage; and since the control circuitry of a NAND memory can typically apply higher voltage levels to word lines than bit line, the following embodiment sets the word lines to a higher voltage (one of the operating voltage levels available) and the memory hole to a lower level, such as 0V. Once the word lines and memory holes biased, there can then be a leakage determination, where there are a number of possible embodiments for this. For example, in one set of embodiments the word lines can be charged up, the select gates at one end of the bit lines (source/drain) biased to be off, the select gates on the other end (drain/source) biased to be on and connecting the bit line to ground, and then detecting whether there is current flow from the word lines out the bit line. In another embodiment, the word lines can be charged up and allowed a period of time to discharge by way of leakage to the memory holes, after which a read can be performed since, if there has not been significant leakage the NAND strings will conduct, but if any of the word lines have discharged through leakage the NAND string will not conduct. FIG. 10 illustrates an embodiment of the HIVR test mode of step 727.

FIG. 10 is a flowchart for an embodiment of a post-erase HIVR test mode. At step 1001 the word lines of the bock are biased to be set at a high operating voltage, such as Vread or an erase verify voltage level. Referring back to FIG. 2A or 2B, the array driver 224 can apply the high voltage level to the word lines of a block by use of the row decoder 222 and block select circuitry 226, after which the charge can be trapped on the block's word lines. Step 1003 biases the memory hole to a low voltage, such as 0V, from one or both of the corresponding bit line through the drain side select gates and the source line through the source side select gates by the column control circuitry. The select gates are then biased to connected the memory hole to ground allow any leakage current to flow from the word lines of the block to the memory holes at step 1005, where this can be the same as step 1003 or a separate step. For example, the memory holes could be set to ground from the bit lines by having the drain side select gates on for step 1003 and then the drain side select gates can be left on for step 1005 to allow the leakage current to drain off from any defective word lines. A similar process for steps 1003 and 1005 could be performed from the source side, or the memory hole could be biased from one side at step 1003 and step 1005 could drain off the leakage current from the other side. Additionally, either of steps 1003 and 1005 can be performed as a two sided process by biasing both of the drain and source side select gates to be on.

Step 1007 determines whether there is word line-memory hole leakage once the block is biased according to steps 1001, 1003, and 1005. A number of embodiments are available for this determination. For example, leakage current either though the drain side select gate to the bit lines or through the source side select gate to the source line can be measure through circuitry in the column control circuitry 210. Alternate, after trapping charge on the word lines for an interval, the voltage levels on the word lines can be measured to see if there has been appreciable discharge from the block's word lines. In other embodiments, after allow a discharge period for any leaking word lines, a read can be performed of the memory block to see whether one or more word lines have discharged to the extent that they turn off the NAND string. Bases on the result of the detection at step 1007, step 1009 determines whether the block is defective.

Returning again to FIG. 7, the shown embodiment includes the three post-erase test modes described above at step 721. Other embodiments can include alternate or additional tests, where these can be selected based on the failure mechanisms exhibited by a given memory device. Additionally, although FIG. 7 shows only a single determination step 717 for whether or not the post-erase test modes are enabled, in some embodiments an independent determination can be make for each of the test modes as noted above.

The post-erase test modes can improve memory operation by catching grown defects, but comes at the cost of a time penalty for executing the tests. For example, in a typical implementation, the time of the erase and verify for a block at steps 711 and 713 take longer than the example set of post-erase tests at step 721, but the post-erase tests can be of comparable duration (e.g., on the order of 60%-80% of the erase+erase verify time). Consequently, to maintain performance while still being able catch grown defects, the memory could be improved by speeding up the time needed to execute the post-erase tests. The flowing presents techniques that can speed up the post-erase tests by ~⅓ or more.

The post-erase test time, $T_PET$, will be the sum of the time for the enable post-erase test modes, or, in the example:

$$T_{PET} + T_{TDR} + T_{XOREV} + T_{HIRV}.$$

As described above with respect to FIGS. 8-10, each of these test modes requires biasing the block of the memory being tested, where the word lines and other lines are biased to voltage similar to other sensing operations, such as a data read or a verify for program or erase. To set these various bias levels the array drivers 224 ramp up the word lines, dummy word lines, source line, and select gates to any non-zero operating voltages, and the driver circuits 214 bias bit lines/memory holes. For voltage levels above the supply level, charge pumps can be used.

To establish the operating voltage levels for the different lines, the driver circuits ramp up the voltages to corresponding levels at a ramp rate and to a value based on trim values and setting that optimized for data read operations and verify (both program and erase). The setting of these values is a tradeoff between the speed of rapid ramp rates and the accuracy and lower current consumption of slower ramp rates. In the usual implementation, the post-erase test modes would use the same parameter sets, where these parameters can be determined at post production tests (e.g., die sort and device characterization) and set in the register values in storage section 266 of system control logic 260. However, the post-erase test modes differ from other sensing operations in that do not need to accurately determine threshold voltage at the memory cells level, but typically just want to determine whether a set of memory cells or (in the TDR mode) select gates have a Vth under a particular value. Additionally, these post-erase test modes are additional tests performed after the memory block has passed erase verify and can be effective with less accurately established bias levels.

Embodiments presented here introduce design changes to speed up the total duration of the post-erase test modes. More specifically, the post-erase test operations are sped up by increasing ramp speeds for setting bias levels for these operations relative to the normal read and verify operations, which are left using the standard operating parameter values. This can speed up the example TDR, XOREV, and HIVR tests, but can leave the detect operations of these processes that are performed to judge a blocks pass/fail untouched. For example, bias voltages such as Vread for the post-erase tests are ramped at a faster rate, where this has fairly minimal effects on overall erase operation current levels. The timing used to perform the post-erase test mode sensing phases can also be ran faster than the timing numbers used in standard read and verify operations. The parameters for the post-erase test modes can be determined at post production tests (e.g., die sort and device characterization) and set in the register values in storage section 266 of system control logic 260.

Figure 11:
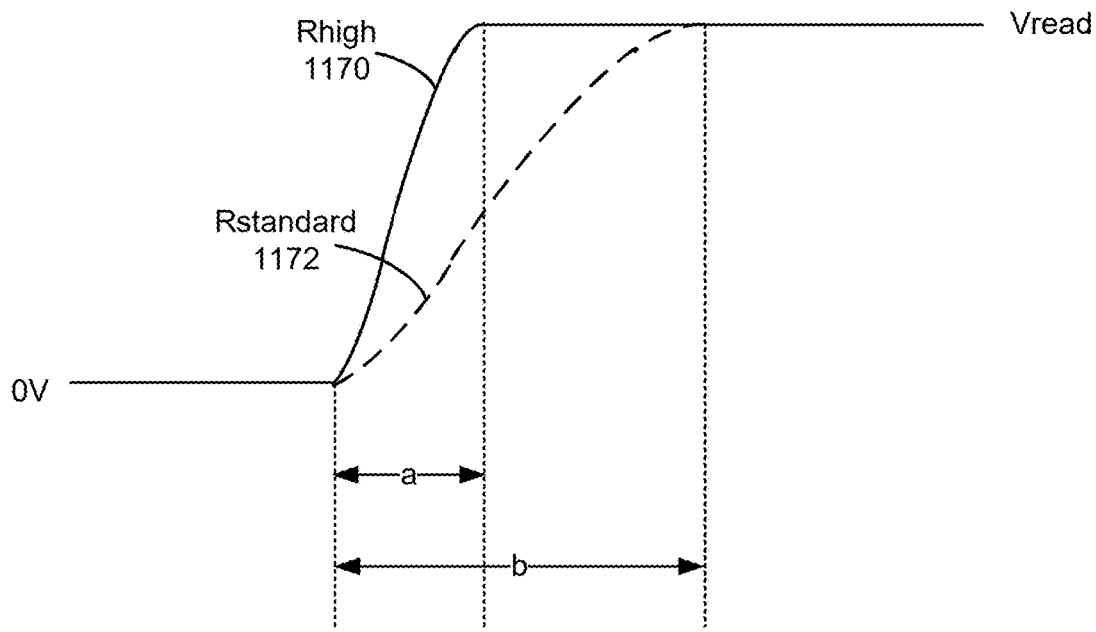
FIG. 11 depicts example voltage signals for ramping up an operating voltage at different rates.

FIG. 11 depicts example voltage signals for ramping up an operating voltage, in this case Vread, for biasing a memory array. From an initial value of 0V, the voltage is ramped up to the final value Vread that can be applied to the corresponding control lines (e.g., word lines of the selected block). In FIG. 11 there is a continuous increase in the voltage signals (plots 1170 and 1172), and example rates of increase are Rhigh (a high rate) and Rstandard (a low rate), respectively. The standard ramp rate Rstandard 1172 can correspond to the case of a normal read or verify operation. The accelerated ramp rate Rhigh 1170 can correspond to the post-erase test modes. As also illustrated in FIG. 11, this results in a ramp up time interval "a" that is much shorter for the post-erase test modes than the time interval "b" of standard operations. Although described with respect to the Vread level, this approach can similarly be applied to other bias voltage used in the post-erase test modes.

Figure 13:
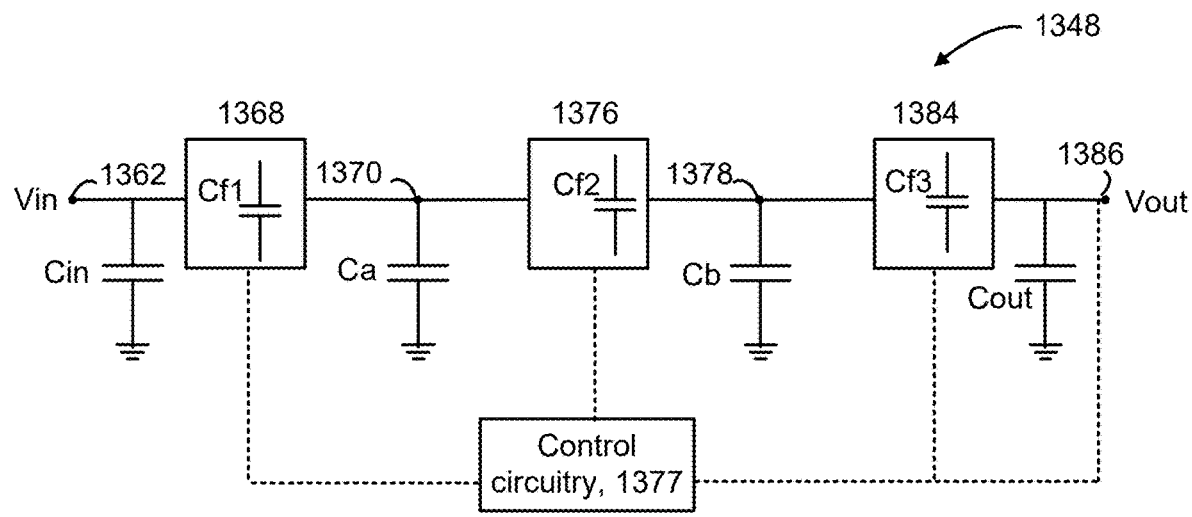
FIG. 13 depicts an example implementation of a multi-stage charge pump that can generate the Vead voltage level waveforms of FIG. 11
Figure 12A:
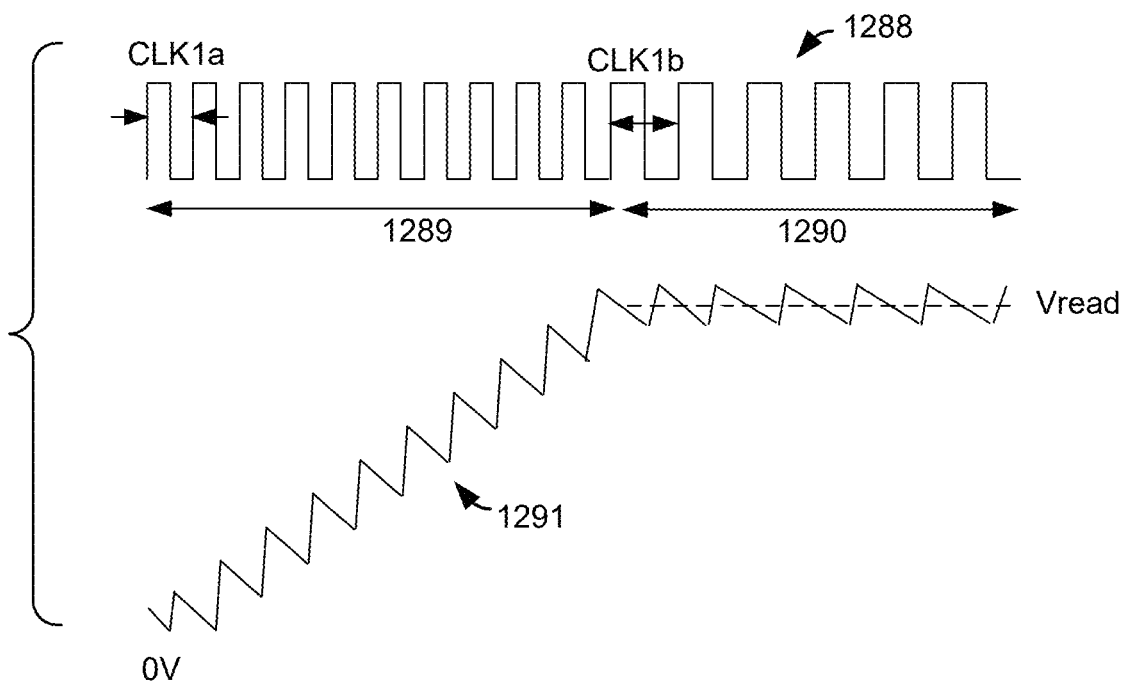
FIGS. 12A and 12B depict two example clock signals that can used to achieve different ramp rates as in FIG. 11 for the charge pump of FIG. 13.
Figure 12B:
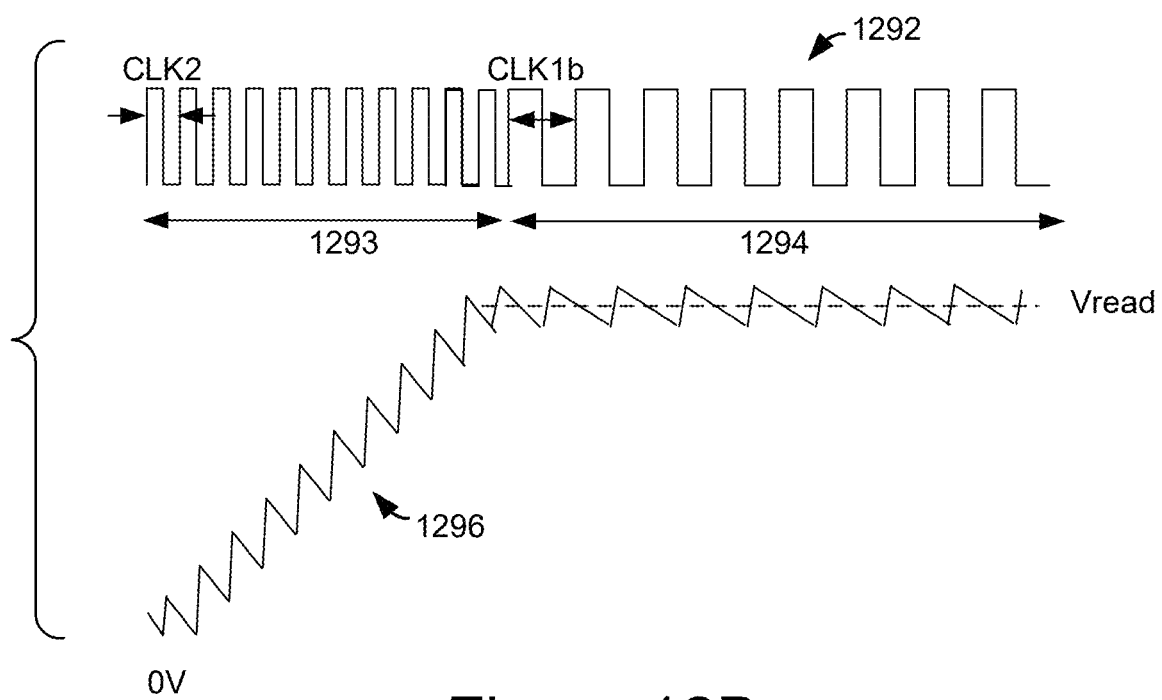

FIGS. 12A and 12B depict two example clock signals that can used to achieve different ramp rates as in FIG. 11 for the charge pump of FIG. 13. FIG. 12A depicts an example clock signal 1288 and output voltage 1291 of the charge pump of FIG. 13 where a lower ramp up rate (Rstandard) is used. The clock signal is provided by the control circuitry of the charge pump to activate switches in the stages of the charge pump. The output voltage increases with each charge period, starting from 0V and ending at Vread. The output voltage has a ripple shape due to the repeated charging and discharging of the capacitors in the charge pump. The clock signal has period CLK1a in a time period 1289 in which the output voltage increases. The clock signal then changes to have a period CLK1b>CLK1a in a time period 1290 when the output voltage reaches Vread, and the output voltage subsequently remains at Vread. The output voltage can return to 0 V or other initial level at a designated time.

FIG. 12B depicts an example clock signal 1292 and output voltage 1296 of the charge pump of FIG. 13 where a higher ramp up rate (Rhigh) is used, relative to the example of FIG. 12A. The output voltage increases with each charge period, starting from 0 V and ending at Vread, for example. The clock signal has period CLK2<CLK1a in a time period 1293 in which the output voltage increases. The clock signal then changes to have the period CLK1b>CLK2, as in FIG. 12A, in a time period 1294 when the output voltage reaches Vread, and the output voltage subsequently remains at Vread.

FIG. 13 depicts an example implementation of a multistage charge pump that can generate the Vead voltage level waveforms of FIG. 11, where this can correspond to one of the charge pumps of block 269 of FIG. 2A or 2B. A charge pump is an example of a voltage generator which can provide a higher output voltage than its input voltage. Vin is provided at input node 1362 and Vout is obtained at an output node 1386. For example, Vin may be a fixed power supply voltage sometimes referred to as Vcc or Vdd in a semiconductor chip. In the example Vout is Vread, for instance.

As an example, three stages 1368, 1376, and 1384 are provided. Each stage 1368, 1376, and 1384 can include switches and one or more flying capacitors Cf1, Cf2 and Cf3, respectively, such as a MOS (metal oxide semiconductor) capacitor. At the node 1362, charge from the input voltage is maintained in an input capacitor Cin which is connected to a ground node. At a node 1370 which is between the first stage 1368 and the second stage 1376, a capacitor Ca is connected to a ground node. At a node 1378 which is between the second stage 1376 and the third stage 1384, a capacitor Cb is connected to a ground node. Finally, at the output node 1386, an output capacitor Cout is connected to a ground node. A multi-stage charge pump can provide greater flexibility in terms of providing a high output voltage and a greater range of output voltages, compared to a single stage charge pump. Further, each stage can include one or more capacitors to provide even greater flexibility.

The multi-stage charge pump 1348 is operated by control circuitry 1377 which controls switching in each stage. The switches may be MOSFETs, bipolar junction transistors or relay switches, for instance. Based on the switching, charge is transferred from the input node 1362 of the first stage to Cf1, and from Cf1 to the node 1370. Charge is then transferred from the node 1370 of the second stage to Cf2 in the second stage, and from Cf2 to the node 1378. Charge is then transferred from the node 1378 to Cf3 in the third stage, and from Cf3 to the output node 1386.

Generally, each stage of the charge pump operation includes two main phases: charging the flying capacitor from the input node, and discharging the flying capacitor into the output node. During each phase, some switches are closed (conductive), connecting the flying capacitor to either the input node, the output node, or a ground node. The control circuitry 1377 may communicate with the output node 1386 as well such as to detect its level and to make adjustments in the charge pump. For example, a switching frequency can be reduced if Vout is above a target voltage, or increased if Vout is below the target voltage. As discussed in connection with FIGS. 12A and 12B, Vout is proportional to the switching frequency. Note that the circuits shown are examples only, as various modifications can be made. Many different charge pump designs exist and other types of voltage driver circuits could be used as well.

By reducing the ramp times by increasing ramp rates and reducing read times using fast read modes, the time for the post-erase test modes can be reduced significantly. In actual devices, this can be a reduction of over ~40%, allowing such test to be incorporated into the erase process as illustrate in FIG. 7 while decreasing the performance penalty. The increase ramp rate can result in increased current during ramp up, but this has been found to be on the order of ~5% for the full erase process, and the peak Icc values during the erase process are unchanged.

In view of the foregoing, a first embodiment includes a non-volatile memory device, comprising a control circuit configured to connect to an array of non-volatile memory cells, the array having a NAND architecture and comprising a plurality of blocks each having plurality of NAND strings of multiple memory cells, the control circuit configured to perform an erase operation on a selected block of the array, where, to perform the erase operation. The control circuit is configured to: bias the selected block to erase the memory cells thereof; subsequently perform an erase verify on the selected block, the erase verify comprising concurrently applying one or more bias voltages, including a first bias voltage, to the selected block, where to apply the first bias voltage to the selected block the control circuit is configured to ramp up the first bias voltage to a first voltage level at a first ramp rate; determine whether the selected block passed the erase verify; in response to passing erase verify, perform one or more post-erase memory tests on the selected block, each post-erase memory test comprising applying the first bias voltage to the selected block, where to apply the first bias voltage to the selected block the control circuit is configured to ramp up the first bias voltage to the first voltage level at a second ramp rate, the second ramp rate being higher than the first ramp rate; and determine whether the selected block passed post-erase memory tests.

One embodiment includes a method for performing an erase operation on a selected block of an array of non-volatile memory cells having a NAND architecture and comprising a plurality of blocks each having plurality of NAND strings of multiple memory cells, the erase operation comprising: biasing the selected block to erase the memory cells thereof; subsequently performing an erase verify on the selected block, the erase verify comprising concurrently applying one or more bias voltages, including a first bias voltage, to the selected block, including ramping up the first bias voltage to a first voltage level at a first ramp rate; determining whether the selected block passed the erase verify; in response to passing erase verify, performing one or more post-erase memory tests on the selected block, each post-erase memory test comprising applying the first bias voltage to the selected block, including ramping up the first bias voltage to the first voltage level at a second ramp rate, the second ramp rate being higher than the first ramp rate; and determining whether the selected block passed post-erase memory tests.

One embodiment includes a non-volatile memory device, comprising: a memory die comprising a plurality blocks, each block comprising NAND strings comprising memory cells, each block comprising word lines connected to control gates of the memory cells of the NAND strings; a voltage generator configured to generate a first bias voltage at a first voltage level; and one or more control circuits in communication with the blocks and with the voltage generator. The one or more control circuits are configured to: bias a selected block to erase the memory cells thereof; subsequently perform an erase verify on the selected block, the erase verify comprising concurrently applying one or more bias voltages, including the first bias voltage, to the selected block, where to apply the first voltage level to the selected block the control circuit is configured to operate the voltage generator to ramp up the first bias voltage to the first voltage level at a first ramp rate; determine whether the selected block passed the erase verify; in response to passing erase verify, perform one or more post-erase memory tests on the selected block, each post-erase memory test comprising applying the first bias voltage to the selected block, where to apply the first bias voltage to the selected block the control circuit is configured to operate the voltage generator to ramp up the first bias voltage to the first voltage level at a second ramp rate, the second ramp rate being higher than the first ramp rate; and determine whether the selected block passed post-erase memory tests.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device comprising:
   a control circuit configured to connect to an array of non-volatile memory cells having a NAND architecture and comprising a plurality of blocks each having plurality of NAND strings each comprising a plurality of the memory cells connected in series between a first select gate and a second select gate, the control circuit configured to perform an erase operation on a selected block of the array, where, to perform the erase operation, the control circuit is configured to:
      bias the selected block to erase the memory cells thereof;
      subsequently perform an erase verify on the selected block, the erase verify comprising concurrently applying one or more bias voltages, including a first bias voltage, to the selected block, where to apply the first bias voltage to the selected block the control circuit is configured to ramp up the first bias voltage to a first voltage level at a first ramp rate;
      determine whether the selected block passed the erase verify:
      in response to passing the erase verify, perform one or more post-erase memory tests on the selected block, each post-erase memory test comprising applying the first bias voltage to the selected block, where to apply the first bias voltage to the selected block the control circuit is configured to ramp up the first bias voltage to the first voltage level at a second ramp rate, the second ramp rate being higher than the first ramp rate, a first of the post-erase memory tests comprising a sensing operation of the first select gates and the second select gates; and
      determine whether the selected block passed the post-erase memory tests, where to determine whether the selected block passed the first of the post-erase memory tests the control circuit is configured to determine the NAND strings of the selected block for which the first select gate and the second select gate conduct in response to applying the first bias voltage to the selected block.

2. The non-volatile memory device of claim 1, wherein the control circuit is on a control die, the non-volatile memory device further comprising:
   a memory die including the array of non-volatile memory cells, wherein the memory die is separate from and bonded to the control die.

3. The non-volatile memory device of claim 1, wherein:
   the selected block comprises a plurality of word lines along which the memory cells of the NAND strings of the selected block are connected;
   a second of the post-erase memory tests comprises:
      performing a first sensing operation in which even word lines, but not odd word lines, of the selected block are biased by the first bias voltage; and
      performing a second sensing operation in which the odd word lines, but not the even word lines, of the selected block are biased by the first bias voltage; and
   to determine whether the selected block passed the second of the post-erase memory tests the control circuit is further configured to compare a number of the NAND strings of the selected block that conduct in the first sensing operation to a number of the NAND strings of the selected block that conduct in the second sensing operation.

4. The non-volatile memory device of claim 1, wherein:
   the array of non-volatile memory cells has a three-dimensional architecture in which word lines run horizontally relative to a substrate and the memory cells are formed along memory holes running vertically through the word lines;
   a second of the post-erase memory tests comprises biasing the word lines of the selected block to one bias level and biasing the memory holes of the selected block to another bias level; and
   to determine whether the selected block passed first of the post-erase memory tests the control circuit is further configured to determine whether there is leakage between the word lines of the selected block and the memory holes of the selected block.

5. The non-volatile memory device of claim 1, wherein to perform the erase operation, the control circuit is further configured to:
   in response to passing erase verify, determine whether the one or more post-erase memory tests are enabled, wherein the one or more post-erase memory tests on the selected block are further performed in response to being enabled.

6. The non-volatile memory device of claim 1, wherein the control circuit is further configured to:
   prior to biasing the selected block to erase the memory cells thereof, performing a read operation on memory cells of the selected block, the read operation comprising applying the first bias voltage to the selected block, where to apply the first bias voltage to the selected block the control circuit is further configured to:
      ramp up the first bias voltage to the first voltage level at the first ramp rate.

7. The non-volatile memory device of claim 6, wherein:
   the selected block is comprised of a plurality of word lines along which the memory cells of the NAND strings of the selected block are connected; and
   in performing the read operation the control circuit is further configured to apply the first bias voltage to non-selected ones of the word lines.

8. The non-volatile memory device of claim 1, wherein the control circuit is further configured to:
   in response to not passing erase verify, subsequently re-bias the selected block to erase the memory cells thereof; and subsequent to re-biasing the selected block to erase the memory cells thereof, perform an additional erase verify on the selected block.

9. A method, comprising:
performing an erase operation on a selected block of an array of non-volatile memory cells having a three-dimensional NAND architecture in which word lines run horizontally relative to a substrate and the memory cells are formed along memory holes running vertically through the word lines and comprising a plurality of blocks each having plurality of NAND strings of multiple memory cells, the erase operation comprising:
biasing the selected block to erase the memory cells thereof;
subsequently performing an erase verify on the selected block, the erase verify comprising concurrently applying one or more bias voltages, including a first bias voltage, to the selected block, including ramping up the first bias voltage to a first voltage level at a first ramp rate;
determining whether the selected block passed the erase verify;
in response to passing erase verify, performing one or more post-erase memory tests on the selected block, each post-erase memory test comprising applying the first bias voltage to the selected block, including ramping up the first bias voltage to the first voltage level at a second ramp rate, the second ramp rate being higher than the first ramp rate, a first of the post-erase memory tests comprising biasing the word lines of the selected block to one bias level and biasing the memory holes of the selected block to another bias level; and
determining whether the selected block passed the post-erase memory tests, including determining whether the selected block passed the first of the post-erase memory tests includes determining whether there is leakage between the word lines of the selected block and the memory holes of the selected block.

10. The method of claim 9, wherein each of the NAND strings of the selected block comprise a plurality of the memory cells connected in series between a first select gate and a second select gate, and wherein:
performing a second of the post-erase memory tests comprises performing a sensing operation of the first select gates and the second select gates; and
determining whether the selected block passed the second of the post-erase memory tests includes determining the NAND strings of the selected block for which first select gate and the second select gate conduct in response to applying the first bias voltage to the selected block.

11. The method of claim 9, wherein the selected block comprised a plurality of word lines along which the memory cells of the NAND strings of the selected block are connected and:
performing a second of the post-erase memory tests comprises:
performing a first sensing operation in which even word lines, but not odd word lines, of the selected block are biased by the first bias voltage; and
performing a second sensing operation in which the odd word lines, but not the even word lines, of the selected block are biased by the first bias voltage; and determining whether the selected block passed the second of the post-erase memory tests comprises:
comparing a number of the NAND strings of the selected block that conduct in the first sensing operation to a number of the NAND strings of the selected block that conduct in the second sensing operation.

12. The method of claim 9, wherein performing the erase operation further comprises:
in response to passing erase verify, determining whether the one or more post-erase memory tests are enabled, wherein the one or more post-erase memory tests on the selected block are further performed in response to being enabled.

13. The method of claim 9, further comprising:
prior to biasing the selected block to erase the memory cells thereof, performing a read operation on memory cells of the selected block, the read operation comprising applying the first bias voltage to the selected block, including:
ramping up the first bias voltage to the first voltage level at the first ramp rate.

14. The method of claim 13, wherein the selected block comprised a plurality of word lines along which the memory cells of the NAND strings of the selected block are connected, and wherein
performing the read operation includes applying the first bias voltage to non-selected ones of the word lines.

15. The method of claim 9, further comprising:
in response to not passing erase verify, subsequently re-biasing the selected block to erase the memory cells thereof; and
subsequent to re-biasing the selected block to erase the memory cells thereof, performing an additional erase verify on the selected block.

16. A non-volatile memory device, comprising:
a memory die comprising an array of non-volatile memory cells having a plurality blocks, each block comprising NAND strings comprising a plurality of memory cells, each block comprising word lines connected to control gates of the memory cells of the NAND strings and the array having a three-dimensional architecture in which word lines run horizontally relative to a substrate and the memory cells are formed along memory holes running vertically through the word lines;
a voltage generator configured to generate a first bias voltage at a first voltage level; and
one or more control circuits in communication with the blocks and with the voltage generator, wherein the one or more control circuits are configured to:
bias a selected block to erase the memory cells thereof;
subsequently perform an erase verify on the selected block, the erase verify comprising concurrently applying one or more bias voltages, including the first bias voltage, to the selected block, where to apply the first voltage level to the selected block the control circuit is configured to:
operate the voltage generator to ramp up the first bias voltage to the first voltage level at a first ramp rate;
determine whether the selected block passed the erase verify;
in response to passing erase verify, perform one or more post-erase memory tests on the selected block, each post-erase memory test comprising applying the first bias voltage to the selected block, a first of the post-erase memory tests comprising biasing the word lines of the selected block to one bias level and biasing the memory holes of the selected block to another bias level, and where to apply the first bias voltage to the selected block the control circuit is configured to:
  operate the voltage generator to ramp up the first bias voltage to the first voltage level at a second ramp rate, the second ramp rate being higher than the first ramp rate; and
determine whether the selected block passed the post-erase memory tests, where to determine whether the selected block passed first of the post-erase memory tests the control circuit is further configured to determine whether there is leakage between the word lines of the selected block and the memory holes of the selected block.

17. The non-volatile memory device of claim 16, wherein:
each of the NAND strings of the selected block comprise a plurality of the memory cells connected in series between a first select gate and a second select gate,
a second of the post-erase memory tests comprises a sensing operation of the first select gates and the second select gates; and
to determine whether the selected block passed the second of the post-erase memory tests the control circuit is further configured to determine the NAND strings of the selected block for which first select gate and the second select gate conduct in response to applying the first bias voltage to the selected block.

18. The non-volatile memory device of claim 16, wherein:
the selected block is comprised of a plurality of word lines along which the memory cells of the NAND strings of the selected block are connected;
a second of the post-erase memory tests comprises:
  performing a first sensing operation in which even word lines, but not odd word lines, of the selected block are biased by the first bias voltage; and
  performing a second sensing operation in which the odd word lines, but not the even word lines, of the selected block are biased by the first bias voltage; and
to determine whether the selected block passed the second of the post-erase memory tests the control circuit is further configured to compare a number of the NAND strings of the selected block that conduct in the first sensing operation to a number of the NAND strings of the selected block that conduct in the second sensing operation.

19. The non-volatile memory device of claim 16, wherein the control circuit is further configured to:
prior to biasing the selected block to erase the memory cells thereof, performing a read operation on memory cells of the selected block, the read operation comprising applying the first bias voltage to the selected block, where to apply the first bias voltage to the selected block the control circuit is further configured to:
  ramp up the first bias voltage to the first voltage level at the first ramp rate.

20. The non-volatile memory device of claim 19, wherein:
the selected block is comprised of a plurality of word lines along which the memory cells of the NAND strings of the selected block are connected; and
in performing the read operation the control circuit is further configured to apply the first bias voltage to non-selected ones of the word lines.

* * * * *